United States Patent
Yakshin et al.

(10) Patent No.: US 7,172,788 B2
(45) Date of Patent: Feb. 6, 2007

(54) OPTICAL ELEMENT AND METHOD FOR ITS MANUFACTURE AS WELL AS LITHOGRAPHY APPARATUS AND METHOD FOR MANUFACTURING A SEMICONDUCTOR DEVICE

(75) Inventors: Andrey E. Yakshin, Nieuwegein (NL); Eric Louis, Ijsselstein (NL); Frederik Bijkerk, Amsterdam (NL); Marco Wedowski, Aalen (DE); Roman Klein, Berlin (DE); Frank Stietz, Baunatal (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 10/491,764

(22) PCT Filed: Oct. 2, 2002

(86) PCT No.: PCT/EP02/11078

§ 371 (c)(1),
(2), (4) Date: Apr. 2, 2004

(87) PCT Pub. No.: WO03/032329

PCT Pub. Date: Apr. 17, 2003

(65) Prior Publication Data

US 2004/0253426 A1    Dec. 16, 2004

(30) Foreign Application Priority Data

Oct. 4, 2001    (DE)    ............................... 101 50 874

(51) Int. Cl.
B05D 5/06    (2006.01)
G03F 9/00    (2006.01)
B32B 7/02    (2006.01)

(52) U.S. Cl. .................... 427/162; 427/160; 427/402; 428/212; 428/213; 430/396; 356/445

(58) Field of Classification Search ............. 250/492.2, 250/491.1, 160, 162, 402; 356/51, 124, 124.5, 356/445; 378/34, 35; 430/5, 31, 302, 322, 430/396, 966, 967; 427/160, 162, 402, 166, 427/167; 428/212–216
See application file for complete search history.

(56) References Cited

U.S. PATENT DOCUMENTS 3,887,261 A * 6/1975 Spiller ........................ 359/580

(Continued)

FOREIGN PATENT DOCUMENTS

EP    065532 A2    1/2001

(Continued)

OTHER PUBLICATIONS

"Soft X-Ray Optics", Eberhard Spiller, SPIE Optical Engineering Press, Bellingham, WA 98227, (1994) pp. 1-279.

(Continued)

Primary Examiner—Nikita Wells
Assistant Examiner—Bernard Souw
(74) Attorney, Agent, or Firm—Hudak, Shunk & Farine Co.

(57) ABSTRACT

In order to reduce contamination of optical elements which comprise a multilayer system on a substrate, it is proposed that the layer material and/or the layer thickness of at least one layer of the multilayer system are/is selected such that the standing wave which forms during reflection of the irradiated operating wavelength, forms a node of the electrical field intensity (node condition) in the area of the free interface of the multilayer system. Furthermore, a method for determining a design of a multilayer system, as well as a manufacturing process and a lithography apparatus are described.

24 Claims, 18 Drawing Sheets

U.S. PATENT DOCUMENTS

| | | | | |
|---|---|---|---|---|
| 4,147,409 | A | * | 4/1979 | Apfel ........................... 359/584 |
| 4,769,290 | A | * | 9/1988 | Hettich et al. ............... 428/432 |
| 5,298,351 | A | * | 3/1994 | Bobroff et al. ................. 430/5 |
| 5,307,395 | A | | 4/1994 | Seely et al. |
| 5,469,489 | A | * | 11/1995 | Miyake et al. ................. 378/35 |
| 5,907,436 | A | * | 5/1999 | Perry et al. .................. 359/576 |
| 6,042,995 | A | * | 3/2000 | White ......................... 430/311 |
| 6,231,930 | B1 | | 5/2001 | Klebanoff |
| 6,274,280 | B1 | * | 8/2001 | Carcia ............................ 430/5 |
| 6,280,906 | B1 | * | 8/2001 | Braat et al. ................. 430/296 |
| 6,410,928 | B1 | * | 6/2002 | Verhoeven et al. ....... 250/492.2 |
| 6,451,414 | B1 | * | 9/2002 | Wheatley et al. ........... 428/212 |
| 6,593,037 | B1 | * | 7/2003 | Gabriel et al. ................. 430/5 |
| 6,645,679 | B1 | * | 11/2003 | La Fontaine et al. ........... 430/5 |
| 6,749,973 | B2 | * | 6/2004 | Shoki et al. .................... 430/5 |
| 6,869,734 | B1 | * | 3/2005 | Lyons et al. .................... 430/5 |
| 6,960,412 | B2 | * | 11/2005 | Shoki ............................. 430/5 |
| 7,060,993 | B2 | * | 6/2006 | Wedowski et al. ........ 250/492.2 |
| 2003/0064161 | A1 | | 4/2003 | Malinowski |
| 2004/0247485 | A1 | * | 12/2004 | Kraus et al .............. 422/82.08 |
| 2004/0253426 | A1 | * | 12/2004 | Yakshin et al. ............. 428/212 |
| 2005/0100797 | A1 | * | 5/2005 | Shoki et al. .................... 430/5 |
| 2005/0104015 | A1 | * | 5/2005 | Wedowski et al. .......... 250/504 |
| 2005/0123014 | A1 | * | 6/2005 | Shimizu et al. ................ 372/45 |
| 2005/0199830 | A1 | * | 9/2005 | Bowering et al. ........... 250/504 |
| 2006/0192158 | A1 | * | 8/2006 | Wedowski et al. .......... 250/504 |

FOREIGN PATENT DOCUMENTS

| | | |
|---|---|---|
| EP | 1065568 A2 | 1/2001 |
| WO | WO 99/24851 | 5/1999 |

OTHER PUBLICATIONS

"Investigation of Carbon Contamination of Mirror Surfaces Exposed to Synchrotron Radiation", K. Boller et al., Nuclear Instruments and Methods 208, (1983) pp. 273-279.

"Beamline for Measurement and Characterization of Multilayer Optics for EUV Lithography", J.H. Underwood et al., SPIE vol. 3331, (1998) pp. 52-61.

"Multilayer Reflectance During Exposure to EUV Radiation", Sebastian Oestreich et al., Proceedings of SPIE, vol. 4146, (2000) pp. 64-71.

* cited by examiner

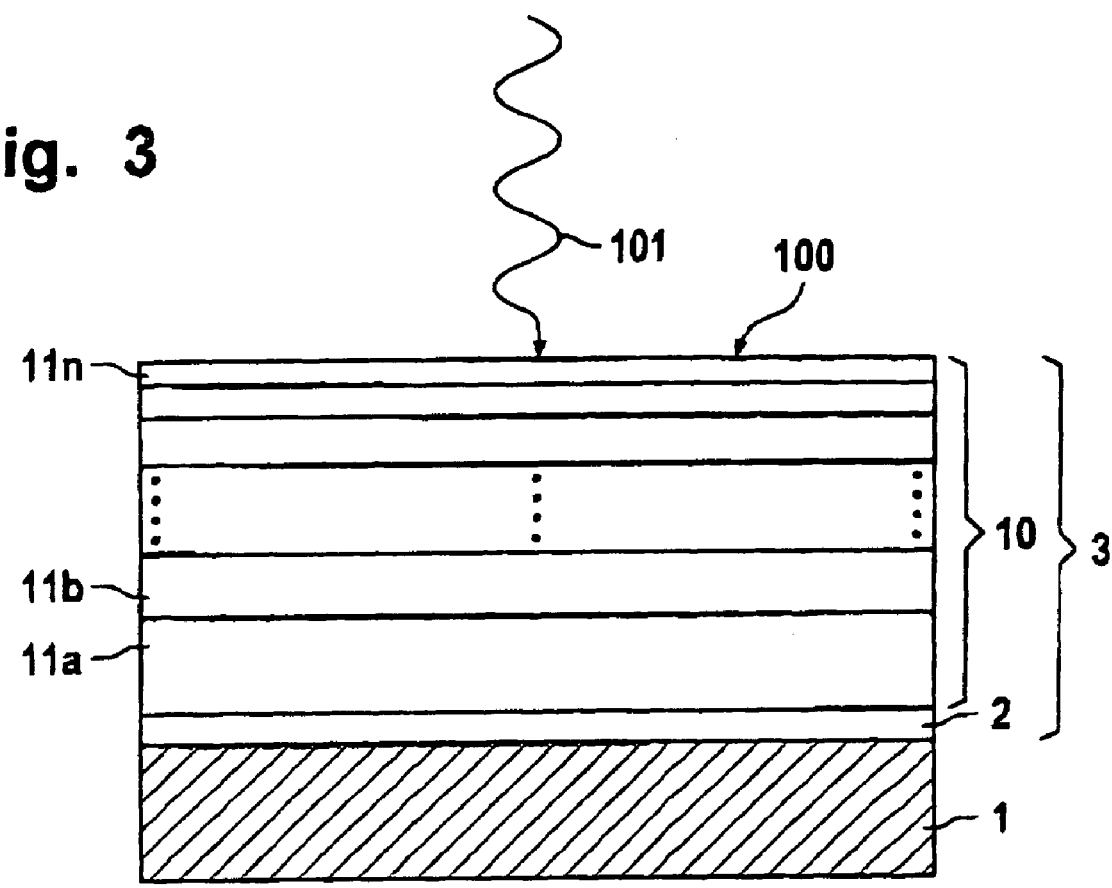

OPTICAL ELEMENT AND METHOD FOR ITS MANUFACTURE AS WELL AS LITHOGRAPHY APPARATUS AND METHOD FOR MANUFACTURING A SEMICONDUCTOR DEVICE

FIELD OF THE INVENTION

The invention relates to an optical element, in particular a mirror or mask, comprising a substrate and an optical multilayer system whose reflectance is maximized for a specified "operating wavelength", in particular for a specified wavelength in the EUV wavelength range. The invention further relates to a method for producing such optical elements and a method for determining a multilayer design, as well as a lithography apparatus and a method for manufacturing semiconductor devices.

BACKGROUND OF THE INVENTION

The term "operating wavelength" of an optical element refers to the wavelength at which the reflectance of the multilayer system is at its maximum.

Optical elements comprising a substrate and a multilayer system which is optimised for high reflectance at a particular wavelength, e.g. photomasks or mirrors for the extreme ultraviolet (EUV) wavelength range, e.g. wavelengths between 11 nm and 16 nm, are in particular required for use in EUV lithography of semiconductor devices.

Such optical elements can also be used as beam control elements or monochromatic illuminators right up into the x-ray range. In the most simple case, a multilayer system comprising a stack of double layers made of a highly absorbent and a poorly absorbent material (with different complex refractive indices), simulates an ideal crystal which meets the Bragg condition, wherein the absorbent layers correspond to the reflection planes in the crystal, while the less absorbent layers function as spacers. For a given material, the thickness of the individual layers is constant across the thickness of the multilayer system. Thus, the thickness ratio in a double layer is also constant. Depending on the requirements of the mirror in relation to the reflection profile, all types of other multilayer systems are however also possible. For example, bandwidth and reflectance can be set in that the multilayer system is made from more than just two materials (e.g. triple layers, quadruple layers, etc.), or that the layer thickness or the thickness ratio of the layers in said multilayer system is not constant (so-called depth-graded multilayers).

In the EUV spectral range, the predominant systems are molybdenum/silicon or molybdenum/beryllium systems. For a standard description of multilayer systems we refer for example to Eberhard Spiller, Soft X-Ray Optics, SPIE Optical Engineering Press, Bellingham, Wash. 98227, USA, ISBN 0-8194-1655-X, ISBN 0-8184-1654-1 (soft). EP 1 065 532 A2 provides an example of highly reflective mirrors for the EUV range, wherein, in order to improve reflectance, the periodicity is broken through by additional layers made of other materials.

As a first layer of the multilayer system, optical elements can comprise special layers on the substrate, with the function of said special layers consisting predominantly of providing the best possible surface finish for the subsequent layers (so-called buffer layer), since in particular in the EUV range, small areas of roughness or ripples can bring about deviations from the ideal layer thickness, such deviations having a noticeable impact on reflectance.

Typical EUV lithography equipment comprises eight or more mirrors. In order to nevertheless achieve adequate overall transmission to the incident radiation, the reflectance of the mirrors must be as high as possible, because the overall intensity is proportional to the product of the reflectance of individual mirrors. If at all possible, the mirrors should maintain this high reflectance during their entire service life. This is an important factor in reducing production costs of e.g. semiconductor components and optical components. With photomasks, too, contamination is a big problem, because the structures to be imaged are no longer in focus as a result of deposits e.g. of carbon. In this document, contamination refers to deposits on the originally free interface, e.g. carbon, and chemical reaction below the free interface, e.g. oxidation. Furthermore, there are irradiation and heat effects which negatively affect the reflectance at "operating wavelength".

Water deposits have their origin in the water fraction contained in the residual gas. Carbon deposits have their origin in hydrocarbons which are outgassed from individual device components or from the photoresist with which the wafer to be exposed to light is coated. For example, irradiation of EUV radiation causes an accumulation of oxide or elemental carbon, because after the reaction under EUV irradiation neither the oxygen (from the oxide) nor the (elemental) carbon, can return to the vacuum.

The correlation between carbon contamination of mirror surfaces and the emission of photoelectrons has already been investigated in H. Boiler et al., Nuclear Instruments and Methods 208 (1983) 273–279. It was found that hydrocarbons which accumulate on the mirror surface are broken down by secondary electrons generated near the free interface, and that as a result of this, the deposition of a permanent carbon layer on the mirror surface is facilitated. Although Boller does not mention this, by analogy, oxidation can be expected in residual gas with a high water content. According to Boller, the secondary electrons are essentially generated independently of the irradiated wavelength, the structure of the irradiated surface, and the angle of incidence.

J. H. Underwood et al., SPIE, vol 3331, pp. 52–61, show that photoemission, via the frequency-dependent reflection peak of multilayer systems experiences a minimum and a maximum, and that the intensity of the photoemission is proportional to the intensity of the electrical field of the standing wave which forms when the incident irradiation is reflected. From these experiments, it is concluded that a phase shift of $\pi/2$ occurs during reflection, between the maximum and the minimum of the field intensity and thus the photoelectric current. Photoemission reacts sensitively to the contamination. Underwood et al. propose that the chemical and physical characteristics of the surface layers be examined by measuring the photoelectrons. This article does neither discuss the influence that the multilayer system has on the photocurrent characteristics, nor its influence on the contamination speed.

S. Oesterreich et al. SPIE, vol. 4146, pp. 64–71, present an investigation of the reflectance of multilayer mirrors, in particular molybdenum/silicon mirrors during EUV irradiation. They note that matching the wavelength of the incident irradiation to the layer thickness (provided the uppermost layer has not oxidized and is of ideal thickness) leads to minimal field intensity at the mirror surface. This is reported to result in the contamination layer probably growing more slowly, thus having less influence on the reflectivity. On the other hand, matching of the wavelength leads to operation outside the operating wavelength, which in turn leads to loss of reflectance. This study does not discuss the relationship between photoemission/electrical field intensity on the one hand, and photoemission/contamination on the other hand.

EP 1 065 568 A2 proposes an EUV lithography apparatus comprising an illumination system for illuminating a photomask, a photomask holding device, a projection system for imaging the photomask onto a substrate, and a substrate holding device, wherein the illumination system and/or the projection system comprise(s) at least one multilayer mirror which comprises a protective layer made of inert material(s).

Preferred materials are diamond-like carbon, boron nitride, boron carbide, silicon nitride, silicon carbide, boron, palladium, ruthenium rhodium, gold, magnesium fluoride, lithium fluoride, tetrafluoroethylene, as well as their compounds or alloys. These protective layers are particularly resistant to oxidation and are characterised by low absorption in the EUV range. The preferred thickness of the layers is between 0.5 nm and 3 nm. A protective layer can comprise individual sub-layers (e.g. two) so as to achieve the best possible reflectance. However, any other contamination of the mirror, apart from oxidation, is only suppressed insignificantly or is not suppressed at all.

The situation is similar in the protective passivation layers for mirrors used in EUV lithography, disclosed in WO 99/24851. A protective layer comprises at least two sub-layers, with an outer layer made of palladium, carbon, carbide, boride, nitride or an oxide; and a subjacent layer made of silicon or beryllium. The thickness of the sub-layers is optimised with a view to good reflectance.

U.S. Pat. No. 6,231,930 discloses protective layers against oxidation, for optical surfaces in lithographic applications, in particular in the EUV range. The surface to be protected is introduced to an atmosphere comprising a gas which contains carbon with functional groups with good surface absorption. During irradiation, the gas molecules are broken down into particles which form a cohesive layer, 0.5 nm to 2 nm in thickness, wherein said cohesive layer adheres well to the surface by way of the functional groups, while being unsuitable as an absorption base for the molecules and molecule fractions that remain in the residual gas of the vacuum. Thus, growth of the protective layer ceases automatically.

U.S. Pat. No. 5,307,395 describes an attempt to increase the service life of a multilayer mirror for the soft X-ray range, in that the layer thickness, in particular in the uppermost thickness, is optimized so that the standing wave which forms, is positioned in a targeted way in relation to the layer boundaries. In this arrangement, a node of the standing wave is positioned exactly in the middle of the uppermost layer. This results in the absolute maximum of the field intensity, and thus the maximum of the absorption, being shifted to the interior of the mirror. As a consequence, damage such as high tension or cracks resulting from excessive irradiation load (approx. 2 to $4*10^8$ W/cm$^2$) is prevented. In the case of EUV mirrors, in particular in lithography equipment, such damage occurs extremely rarely because irradiation load is less severe by several magnitudes (approx. 1 W/cm$^2$).

SUMMARY OF THE INVENTION

It is the object of the present invention to provide an optical element, which by reducing contamination provides as long a service life as possible with the best possible constant reflectivity, and which can make contribution to reducing the cost of lithography apparatus, and to reducing the production costs of semiconductor devices.

Furthermore, it is the object of the invention to provide a method for manufacturing such optical elements, as well as for determining the multilayer design.

This object is met by an optical element in which the layer material and/or the layer thickness of at least one layer of the multilayer system are/is selected such that the standing wave which forms during reflection of the irradiated "operating wavelength", forms a node of the electrical field strength (node condition) in the area of the free interface of the multilayer system. The term node means a stationary minimum of the electrical field strength.

The invention is based on the surprising recognition that by means of photoinduced secondary electron emission there is a correlation between the electrical field strength of the standing wave at the free interface of the optical element, said standing wave resulting depending on the multilayer design, and the contamination of this free interface. It has been confirmed by experiment that when the electrical field strength of the resulting standing wave at the free interface is minimal or when a node of the standing wave is in the area of the free interface, the emission of secondary electrons generated near the free interface is significantly reduced.

If there is little or no photoemission, breakdown of the residual gas molecules (such as hydrocarbon molecules or water molecules) deposited in a dynamic equilibrium on the mirror surfaces from the residual gas is largely stopped, which otherwise could cause contamination of the free interface. The term vacuum refers to chamber pressures equal or less than 0.1 mbar.

By matching the material and/or the thickness of at least one layer of the multilayer system, a surprisingly simple measure is provided for reducing or entirely preventing contamination, and for increasing the service life of optical elements, wherein an increase of the service life by a factor of 5–50 becomes possible.

During matching to the node condition, it must be ensured that the reflectance characteristics of the multilayer system, which advantageously are first maximized in relation to the "operating wavelength", are not impeded. It has been shown that such matching to the node condition is already possible by means of one layer of the multilayer system and that the reflection characteristics at the "operating wavelength" are only impeded slightly (to below 5%) by matching the node condition. It has been shown that matching the node condition can take place in one or several layers, any layer(s) whatever, within the multilayer system.

The position of the node in the area of the interface means that the node is preferably positioned exactly on the free interface. However, the node can be displaced by ±20%, preferably ±10%, in particular ±5% of the irradiated wavelength. The node can be positioned in front of the free interface or within the uppermost layer of the multilayer system. In a preferred irradiated wavelength of 11–16 nm, the position of the node can be up to 3 nm in front of, or behind, the interface of the multilayer system.

Preferably, the multilayer system comprises a layer pack which is optimized for high reflectance (resonance section), wherein the layer material and/or the thickness of the layer or the layers of the resonance section meets/meet the node condition.

All proven layer designs and layer materials can be used for the resonance section, in particular those described in EP 1 065 568 A2, EP 1 065 532 A2 and WO 99/24851. Matching of the thickness of at least one layer of the layer system is required for setting the node condition.

Matching the node condition can for example take place in that the layer thickness of at least a part of the layers of the resonance section decreases, increases or varies, as the number of layers increases. Furthermore, depth graded multilayers can be used. In such cases it is not necessary, apart from the resonance section which defines the optical characteristics of the optical element, to provide further layers in order to carry out matching the node condition.

According to a further embodiment, matching can also be carried out within the resonance section, in a layer pack selected for this purpose (phase transition section), wherein the layer material and/or the layer thickness of at least one layer of the phase transition section is/are set so as to meet the node condition.

According to a further embodiment, the multilayer system can comprise at least one further layer system on the resonance section, wherein the layer material and/or the thicknesses of the layer or layers of the further layer system are set so as to meet the node condition.

This further layer system can comprise at least one protective layer. In this case the further layer system is the so-called cap section, which covers the resonance section. As in conventional optical elements, the resonance section is only optimized with a view to the best possible reflectance. In contrast, the cap section is optimized with a view to the above-mentioned node condition, wherein however, the reflectance loss of the entire multilayer system has to be kept within the boundaries specified by the desired application of the optical element. The cap section can ensure gradual matching of the layer thickness to the above-mentioned node condition across a multitude of layers. However, the cap section can also make this possible within two or three layers.

Preferably, it is not the protective layer itself which is used for matching the node conditions, but instead, at least one layer arranged below it, is used. In relation to the material used and to the thickness, this makes possible optimal matching of the protective layer to the conditions of the environment, so that the node condition need not be taken into account when selecting a protective layer.

Preferably, the protective layer comprises a material with weak absorption at operating wavelengths, with the half-value thickness of said material exceeding 50 nm.

A protective layer which at the irradiated wavelength already shows reduced photoemission, thus also contributes to a reduction in contamination. In particular, in the case of such protective-layer materials, it is not absolutely necessary for the node position to be exactly on the free interface, so that in some circumstances the entire area of ±20% of the irradiated wavelength can be utilised, without the advantages according to the invention being lost.

The protective layer can comprise a chemically inert material whose absorption is relatively weak, compared to the other materials. This has the advantage that the reflectance is not too much influenced as a result of this, but also that overall fewer secondary electrons are emitted than is the case with more absorbent materials. Preferred materials are ruthenium, rhodium, silicon, molybdenum, boron, carbon, zircon, niobium or carbides, oxides, nitrides, borides or their compounds or alloys.

The additional layer system can also be provided between the cap section and the resonance section. In this case it is referred to as a so-called phase matching section, which in the simplest version comprises an individual layer, for example silicon or $B_4C$, for example with a layer thickness of d (Si) or d($B_4C$)=3 to 4 nm. It is also possible to provide several layers, e.g. containing B, C, N, O and/or Si for the phase matching section.

Preferably, the optical element is optimized for wavelengths between 11 nm and 16 nm. The wavelengths can comprise bandwidths of 0.1 nm–1.0 nm.

Furthermore, it has been shown that the optical element keeps its optical characteristics across an angle of incidence range of up to approx. ±10° to the planar normal of the optical element.

In order to determine the optimal design of a multilayer system, a process of iteration is carried out which is cycled through several times.

First, in a modelling step, modelling calculations are carried out, taking into account the materials for the layers of the specified characteristics of the multilayer system. In this process, the target specifications are defined which e.g. relate to high reflectance, good chemical resistance, large bandwidth, large angular bandwidth, defect smoothing, good stress reduction or easy layer separation. When the optimal design has been found by way of these model calculations, in a coating step, in a coating apparatus, a substrate is coated according to the previously prepared model design. In this procedure, the respective operating parameters are adjusted in the coating apparatus, which operating parameters have been found by experience to be suitable, during operation of the coating apparatus, so as to achieve the desired characteristics.

In a further step, the characterization step, the actual characteristics of the model element are determined by experiment.

In practical experience there are always deviations between the desired characteristics according to the modelling step and the experimental results from the characterization step. This makes necessary the iterative process until the desired characteristics have finally been achieved with the model element. Only when all the respective parameters have been determined, is coating of the optical elements carried out in series.

According to the invention, in Step A (modelling step) and Step B (coating step) the layer material and/or the layer thickness of at least one layer is selected such that the standing wave which forms when the irradiated "operating wavelength" is reflected, in the area of the free interface of the multilayer system comprises a node of the electrical field strength; while in Step C (characterization step) reflectance curve and the photocurrent, caused by secondary electrons emitted from the free interface of the multilayer system, are measured, depending on the irradiated photon energy. Iteration ceases when the absolute maximum of the reflectance curve agrees within a specified range with the absolute minimum of the photocurrent curve. Preferably, iteration ceases when by means of measuring the model element the position of the absolute maximum of the reflectance curve, depending on the irradiated wavelength, agrees with the position of the absolute minimum of the photocurrent curve within a quarter of the bandwidth of the reflectance curve.

The method for manufacturing optical elements provides for the layer materials and/or layer thickness of the multilayer system to be first determined by means of such a design determination method, before coating of the optical elements is carried out in series.

The method for manufacturing an optical element according to a further variant provides for an optical multilayer system to be deposited onto a substrate and for the layer material and/or the thickness of at least one layer of the multilayer system to be selected such that a standing wave which forms during reflection of the irradiated "operating wavelength", forms a node, spaced by ±20% of the irradiated "operating wavelength" from the free interface of the multilayer system.

Preferably, the material and/or the thickness of the layer or the layers are/is selected such that the node is located in front of the free interface of the multilayer system. As a rule, during operation, the multilayer system is exposed to a gaseous mixture comprising e.g. hydrocarbons and water. This operating mode takes advantage of the fact that as a result of contamination, the free interface of the multilayer system quasi moves towards the node of the standing wave. The closer the free interface moves towards the node, the fewer secondary electrons are emitted and the slower the contamination layer grows. When the free interface finally reaches the node, then the contamination layer stops growing.

This results in an optical element which meets the node condition; an element whose photo emission is low at the "operating wavelength", and an element which therefore produces no further contamination or minimal contamination, which can be removed using established cleaning methods.

The lithography apparatus according to the invention provides for at least one optical element of the irradiation system to comprise a multilayer system, wherein the layer material and/or the layer thickness of at least one layer are/is selected such that the standing wave which forms when the irradiated "operating wavelength" is reflected, comprises a node in the area of the free interface of the multilayer system.

The optical element according to the invention is particularly suitable for use in EUV lithography apparatus, either as a mirror or as a reflecting photomask.

The lithography apparatus according to the invention provides advantages in that as a result of reduced contamination and more constant reflectance of the optical elements, the throughput of semiconductor devices to be produced is increased and the service life of the apparatus is prolonged.

A method for producing a semiconductor device comprises the following steps:
  providing a semiconductor substrate which is at least in part coated with a radiation-sensitive material; providing a photomask;
  illuminating the photomask and imaging said photomask onto the radiation-sensitive coating of the semiconductor substrate;
wherein for illumination and/or imaging, an optical system is used which comprises at least one optical element according to the invention. The invention significantly reduces the manufacturing costs for the semiconductor device, which is a mass produced article.

BRIEF DESCRIPTION OF THE DRAWINGS

Below, exemplary embodiments of the invention are described in more detail with reference to drawings, as follows:

FIG. 3 an optical element comprising a multilayer system according to the invention;

FIG. 7 a diagram of the reflectance curve and the photocurrent curve for an optical element according to. FIG. 6;

FIG. 12 a diagram of the reflectance curve and of the photocurrent curve for a mirror according to FIG. 11a;

DETAILED DESCRIPTION OF THE INVENTION

Figure 1:
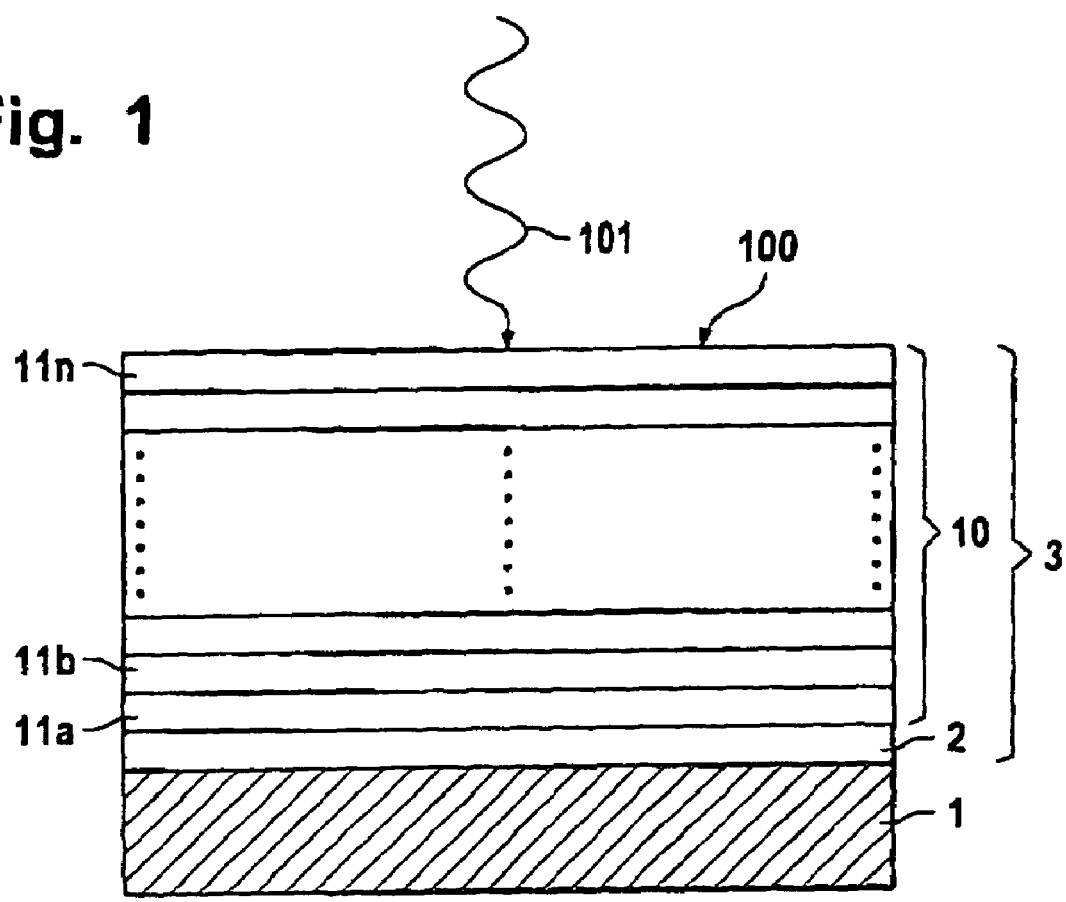
FIG. 1 an optical element comprising a substrate and a multilayer system according to the state of the art.

FIG. 1 shows an optical element comprising a substrate 1, buffer section 2 and a resonance section 10, wherein the buffer section 2 and the resonance section 10 with the layers 11a to 11n constitute the multilayer system 3. Electromagnetic radiation 101 is directed onto the free interface 100.

For example Zerodur® (Schott), Clearceram® (Ohara), fused silica, silicon and ULE® (Corning), can be used as substrate materials. It is not always possible to polish the substrate 1 to the required 0.1 nm microroughness. Therefore the so-called buffer section 2 is used for additional substrate smoothing or substrate preparation prior to the actual coating, i.e. prior to the application of the layers 11a–n of the resonance section 10. The buffer section 2 can also be designed as a separation layer for possible substrate salvage, and correspondingly can comprise chromium or scandium.

Silicon or double layers comprising Mo/Si, e.g. for reducing transmission of the multilayer system, can be other materials for the buffer section.

The resonance section 10 for example comprises periodically arranged Mo/Si with d(Si)=4 nm and d(Mo)=2.9 nm.

Figure 2A:
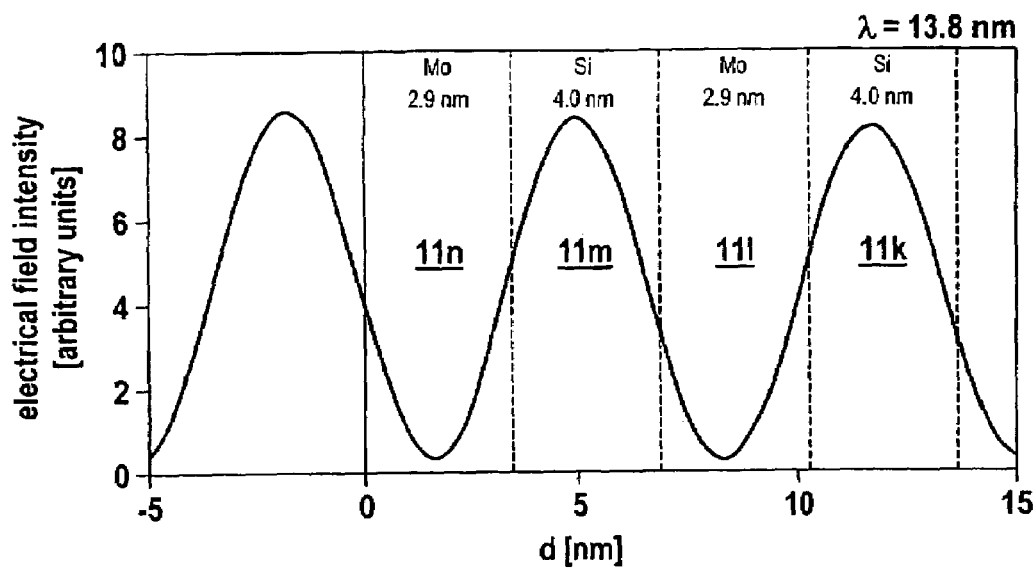
FIG. 2a an intensity diagram of the electrical field of the standing wave across the thickness according to the state of the art.
Figure 2B:
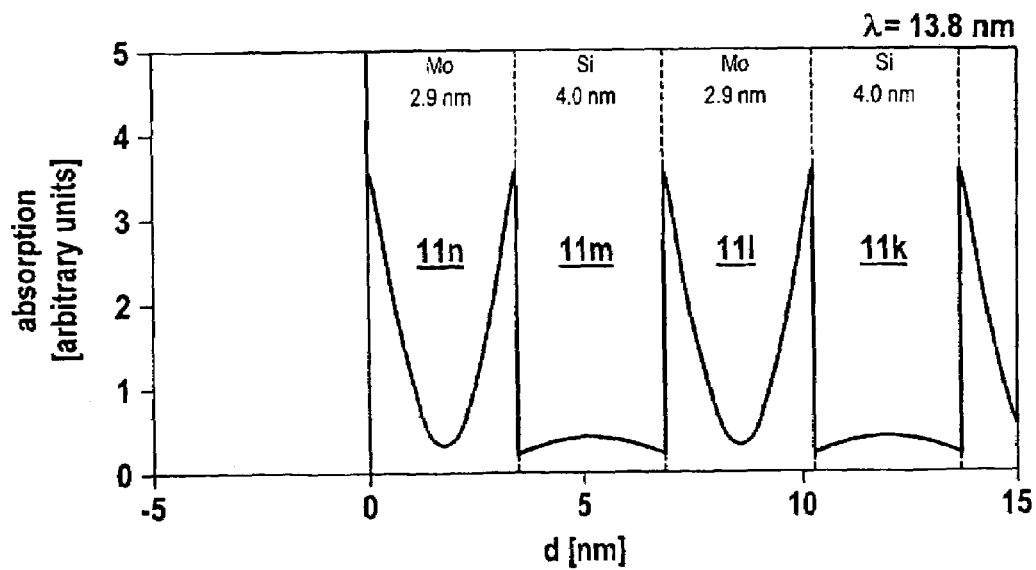
FIG. 2b an absorption curve across the thickness according to the state of the art.

Other materials, too, are possible within the framework of the layer system of the resonance section 10. This has not been taken into account in the present example. In conventional multilayer systems according to U.S. Pat. No. 5,307,395 (Seeley) at an irradiated wavelength of 13.8 nm, there is a calculated intensity curve of the electrical field strength of the standing wave, as shown in FIG. 2a. The zero point is at the free interface 100 of the uppermost layer 11n of the resonance section 10. The dashed lines indicate the interfaces between the individual layers. In FIG. 2a, the layer thicknesses are selected such that the extremes in intensity are positioned exactly in the middle of the layers shown, as has for example been described in U.S. Pat. No. 5,307,395. At the interfaces, there are inflection points to the intensity curve. This results in the absorption curve shown in FIG. 2b. The internal interfaces are again shown by a dashed line.

The position of the absorption edges corresponds to the position of the internal interfaces. There is a high degree of absorption directly on the free interface. In conventional coatings, often the antinode, too, is optimized to the free interface. This results in increasing absorption and thus undesired increased secondary electron emission.

In order to achieve optimization, according to the invention, of the layer structure in relation to the node position, the layer thickness of the Mo layers 11a–n of the resonance section 10 according to FIG. 3, continually decreases towards the free interface layer 100, down to 2:2 nm, while the thickness of the Si layers decreases to 3.4 nm (38×Mo/Si with Si: 3.4 nm, 3.5 nm, . . . , 4.0 nm; Mo: 2.2 nm, 2.3 nm, . . . , 2.9 nm; Si: buffer layer 4 nm; $SiO_2$ substrate).

Figure 4A:
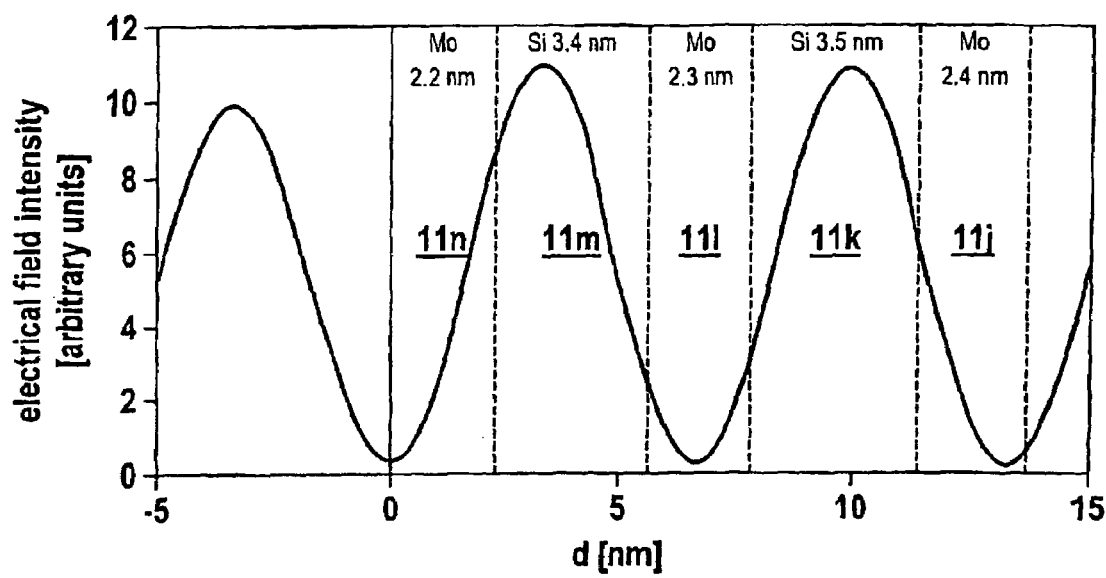
FIG. 4a an intensity curve of the electrical field of the standing wave across thickness for a multilayer system according to FIG. 3.
Figure 4B:
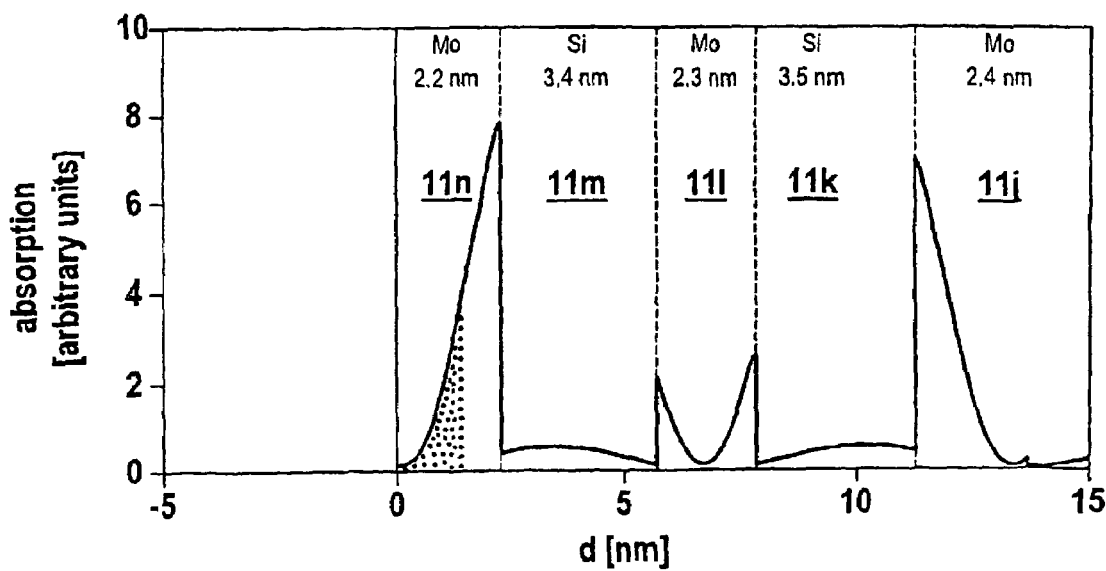
FIG. 4b an absorption curve across the thickness for a multilayer system according to FIG. 3.

FIG. 4a shows the associated electrical field strength of the standing wave which reaches a minimum at the free interface, i.e. at position 0. The thickness of the layers has been selected such that the minimum of the intensity is exactly at the free interface. This leads to little absorption in the area of the outer edge. The normal thickness of the outermost layers is a few nm, while the exit depth of the secondary electrons is around 2 nm. This is the region which is relevant in this example, the region being indicated by the dotted area. In a first approximation, the dotted area below the absorption curve is proportional to the intensity of the photoemission. The latter is considerably reduced relative to the state of the art, e.g. to that in FIGS. 2a and b. Thus, under EUV irradiation, fewer secondary electrons are generated which can be used for cracking residual gas molecules from the vacuum, which are absorbed at the free interface. This results in reduced accumulation of contamination on the mirror surface.

If the layer material and/or the layer thickness is skilfully selected, it is possible to reduce the minima of the field intensity as such. In particular, with the other effects of the layer types, this results in mirrors which combine a long service life and a lasting high degree of reflectance, as will be shown by further examples below.

Figure 5:
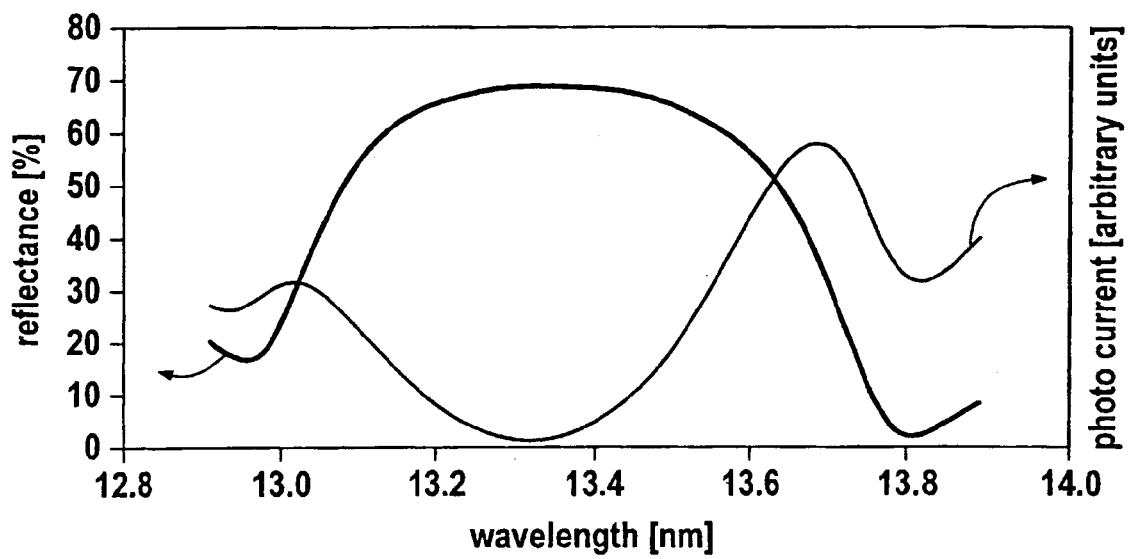
FIG. 5 a diagram of the reflectance curve and of the photocurrent curve depending on the photon energy for a multilayer system according to FIG. 3.

FIG. 5 shows a diagram of the reflectance curve and the associated photocurrent curve for the example according to FIG. 3.

It is clearly shown that the reflectance curve is at its maximum at 13.3 nm, and that the photocurrent curve, which represents a measure of the contamination rate of the free interface, is at its minimum in exactly the same position. At this wavelength, the node of the standing wave is at the free interface of the multilayer system.

Figure 6:
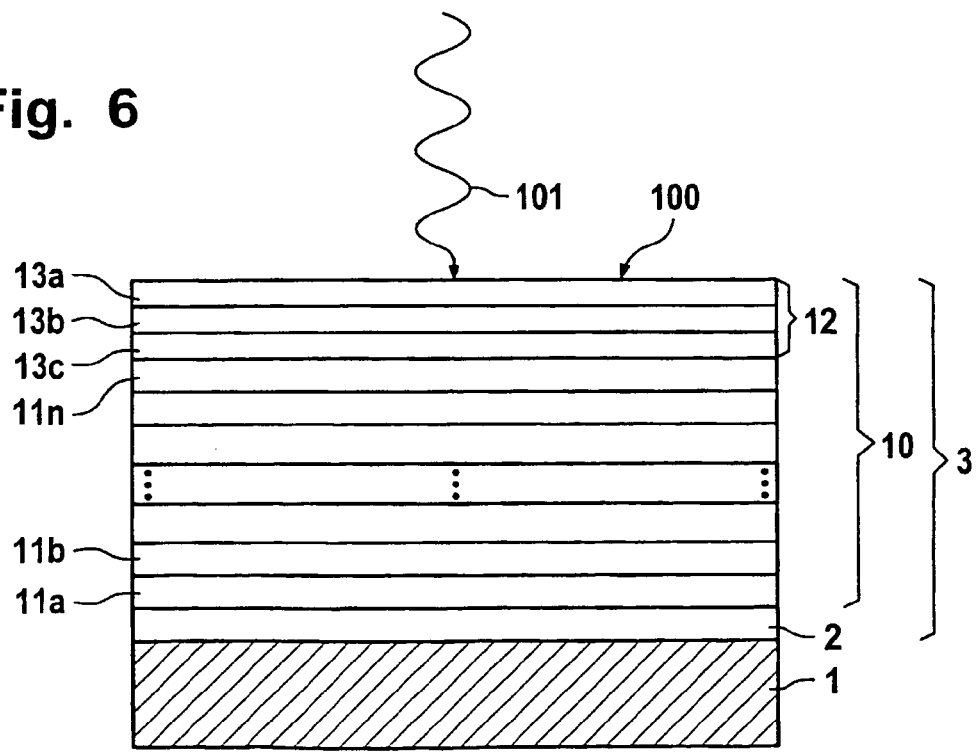
FIG. 6 an optical element comprising a multilayer system according to a further embodiment.

FIG. 6 shows a further embodiment of an optical element. A phase transition section 12 with the layers 13a–13c is shown within the resonance section 10.

The structure of this layer system is as follows:

| Phase transition section: | 13c: Mo | 1.5 nm |
| --- | --- | --- |
| | 13b: Si | 3.5 nm |
| | 13a: Mo | 1.6 nm |
| Resonance section: | 37 x Si | 4.0 nm |
| | Mo | 2.9 nm |
| Buffer section 2: | Si | 4.0 nm |
| Substrate 1: | $SiO_2$ | |

Figure 7:
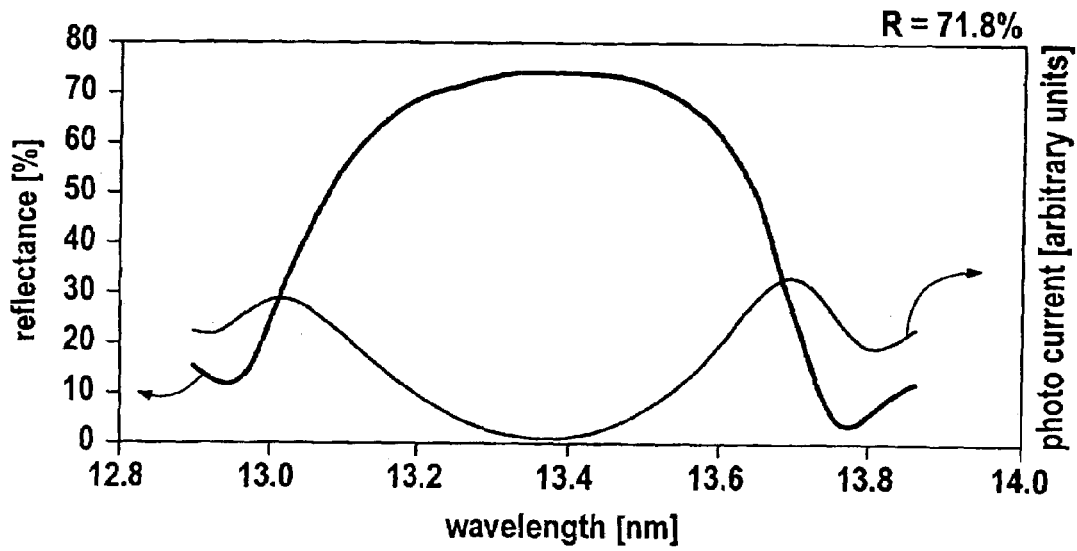

FIG. 7 is a diagram of the reflectance curve and the photocurrent curve for the example shown in FIG. 6.

With this embodiment, too, the maximum of the reflectance curve (Rmax=71.8%) is located at the position of the minimum of the photocurrent curve.

Figure 8:
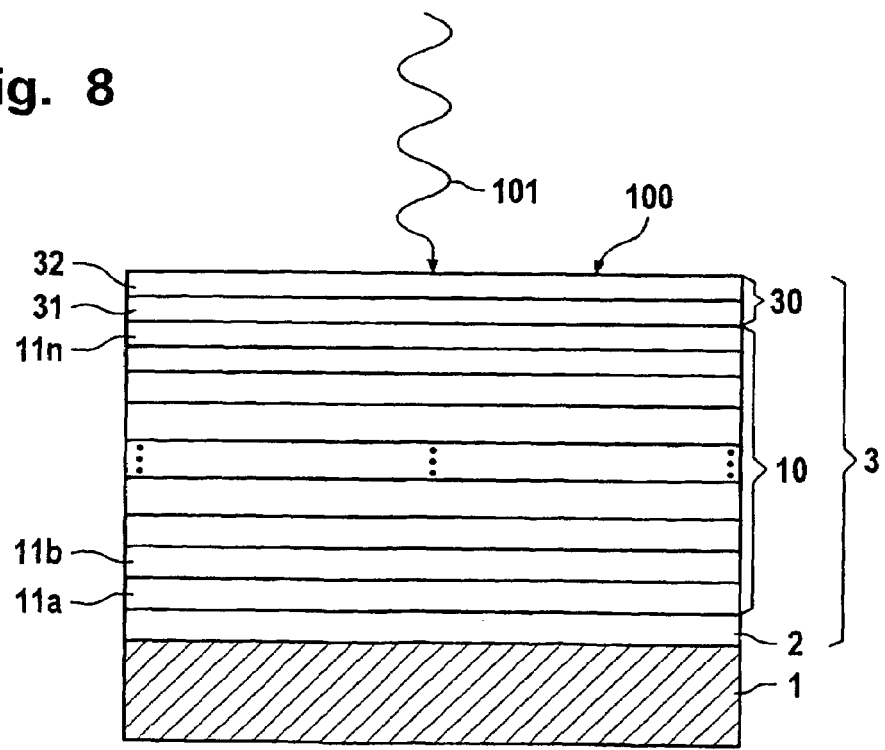
FIG. 8 an optical element comprising a multilayer system according to a further embodiment.

FIG. 8 shows a further embodiment of an optical element. A further layer system, namely the cap section 30, is shown on the resonance section 10. The cop section 30 comprises two layers 31 and 32.

Figure 9:
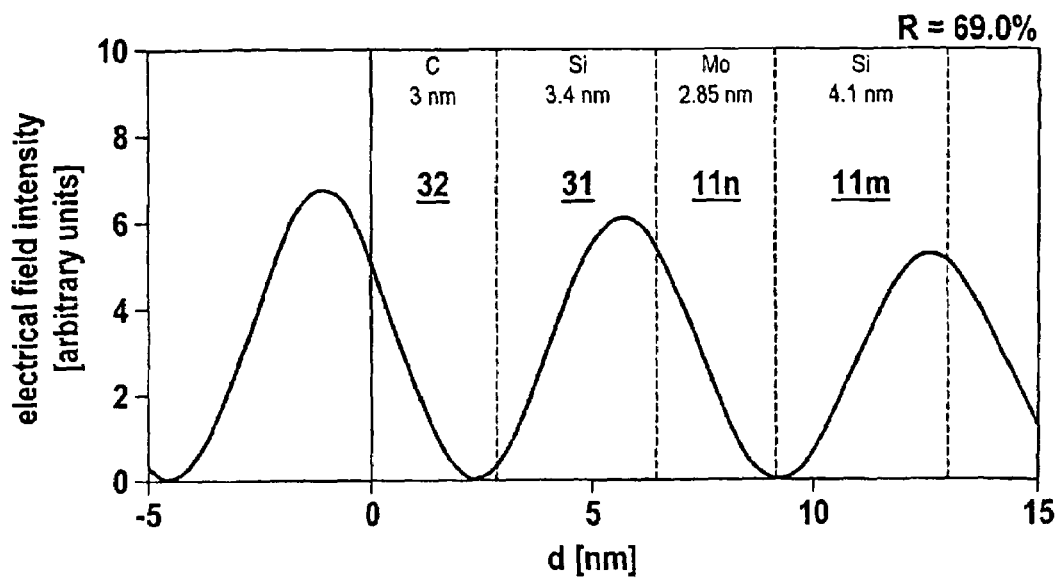
FIG. 9 the intensity of the standing wave across the thickness in a comparison mirror.
Figure 10:
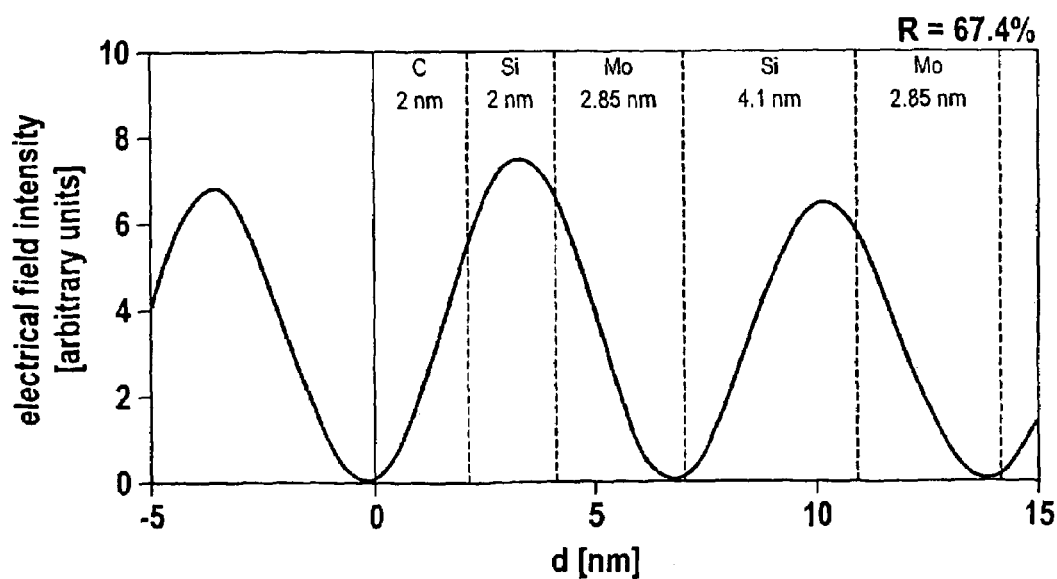
FIG. 10 the intensity of the standing wave across the mirror thickness in a mirror according to FIG. 8.

The structure of the layer system is as follows:

| Cap section: | 32: | C | 3 nm | C | 2 nm |
| --- | --- | --- | --- | --- | --- |
| | 31: | Si | 3.4 nm | Si | 2 nm |
| | | | (s. FIG. 9) | | (s. FIG. 10) |
| Resonance section: | 38 x | Mo | 2.85 nm | | |
| | | Si | 4.1 nm | | |

In FIG. 9, the calculated intensity of the electrical field strength of the standing wave on a mirror has been plotted, with the mirror designed as described above, but with the thickness of the two layers 31, 32 of the cap section only having been selected with a view to maximum reflectance. The selected layer 31 is a silicon layer with a thickness of 3.4 nm, while the selected layer 32 is a carbon layer with a thickness of 3 nm. While this results in a maximum reflectance of 69%, the value of the field intensity is very high at the free interface, which results in increased photoemission and thus increased contamination.

However, if the thickness of the silicon layer and the carbon layer is selected with the proviso that the field intensity at the free interface is minimal (see FIG. 10), then with a layer thickness of 2 nm for each of the layers 31, 32 of the cap section 30, the reflectance is still 67.4%. This reflectance can be further enhanced by respective optimization of the layers. The service life of this optical element has increased significantly because the minimum of the field intensity at the free interface 100 has been reached.

Figure 11A:
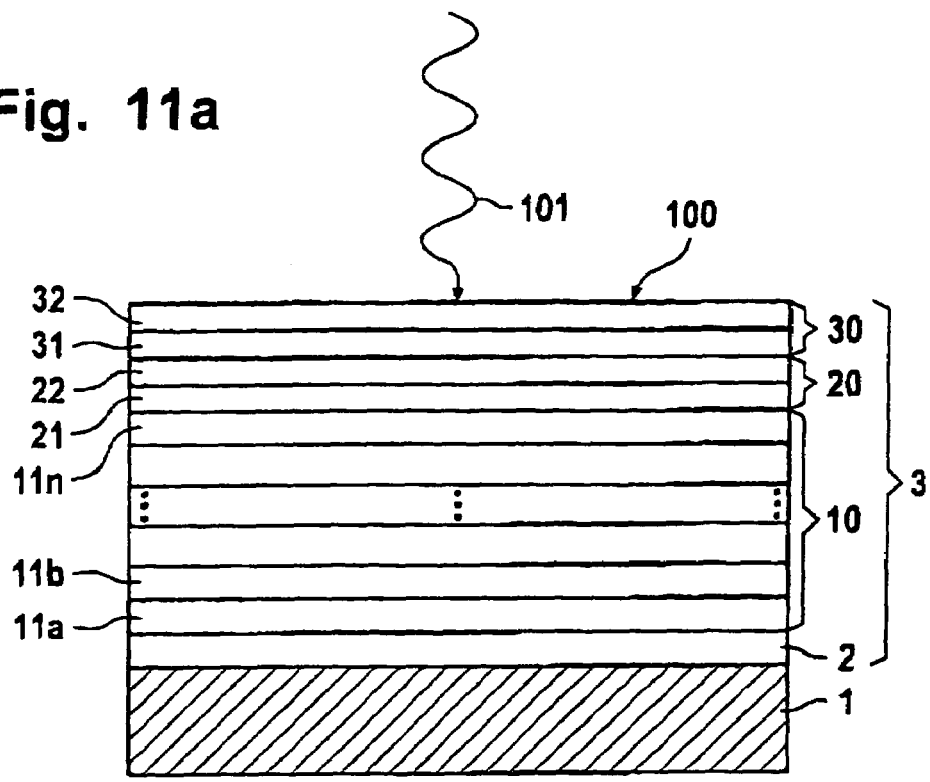
FIG. 11a an optical element with a multilayer system according to a further embodiment with a phase matching section.

FIG. 11a shows a further embodiment of an optical element which provides for a further layer system, namely a phase matching section 20 with layers 21, 22, between the cap section 30 and the resonance section 10.

| Cap section 30: | layer 32 | Ru | d = 1 nm |
| --- | --- | --- | --- |
| | layer 31 | Mo | d = 1 nm |
| Phase matching section 20: | layer 22 | Si | d = 1.9 nm |
| | layer 21 | Mo | d = 2.85 nm |
| Resonance section 10: | 37 x: | Si | d = 4.1 nm |
| | | Mo | d = 2.85 nm |
| Buffer section 2: | | Si | d = 4.0 nm |
| Substrate 1: | | $SiO_2$ | |

Figure 11B:
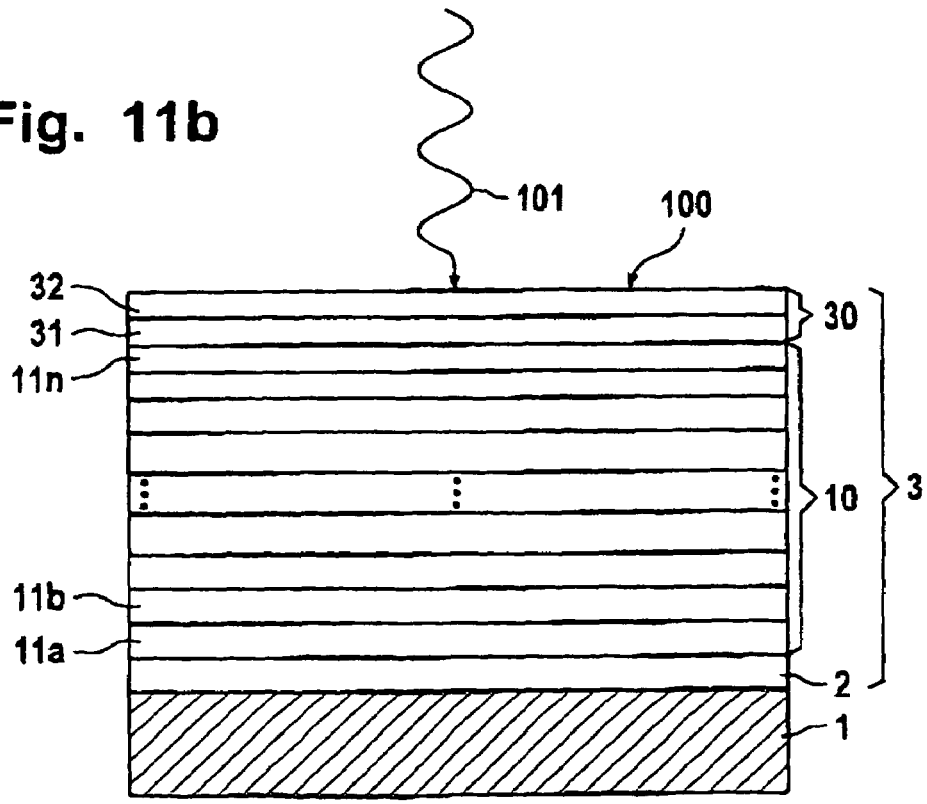
FIG. 11b an optical element comprising a non-matched multilayer system.

FIG. 11b shows a comparison layer system which does not have a phase transition section 20 but instead, in the cap section 30 comprises an Mo layer with a thickness of 2 nm, and an Ru layer with a thickness of 1.5 nm.

Figure 12:
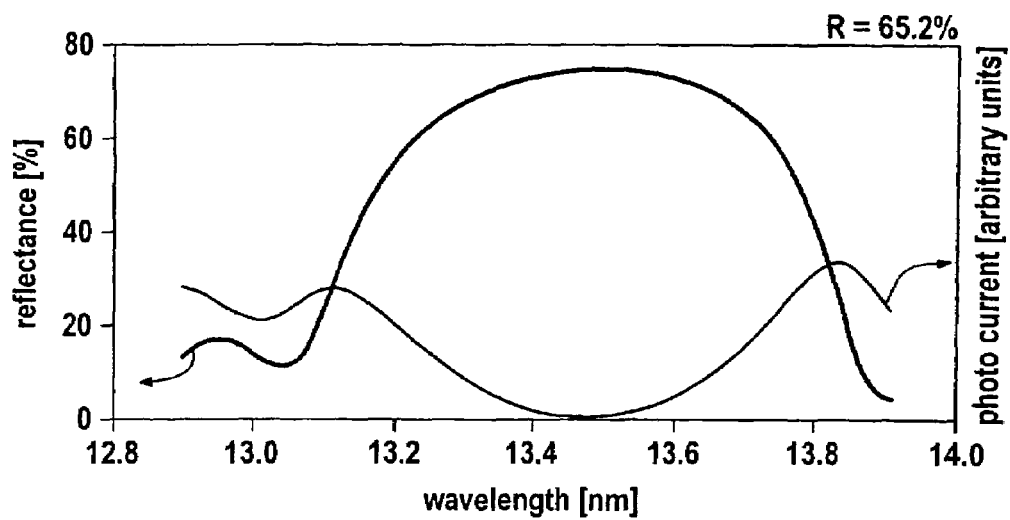
Figure 13:
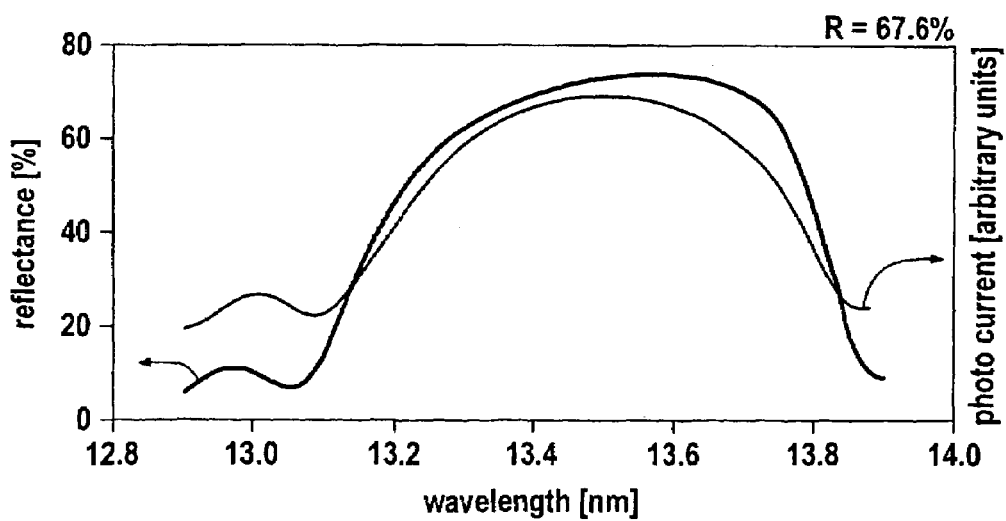
FIG. 13 diagram of the reflectance curve and of the photocurrent curve for a mirror according to FIG. 11b.

FIGS. 12 and 13 show the reflectance curves and the photocurrent curves for the multilayer systems of FIGS. 11a and 11b.

FIG. 12 shows that the multilayer system is optimally matched as a result of the phase matching section. At a wavelength of approx. 13.45 nm, the reflectance curve is at its maximum at a value of 65.2%, and the photocurrent curve is at its minimum.

While in FIG. 13, the example of FIG. 11b shows higher reflectance at 67.6%, the photocurrent curve is however at its maximum at the same position as the reflectance curve; consequently there is severe contamination of the free interface.

Figure 14:
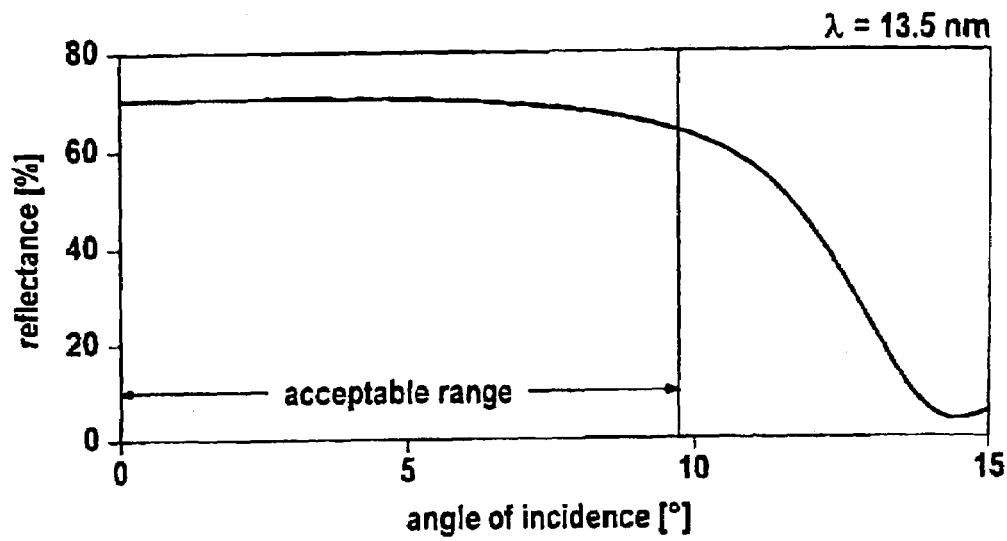
FIGS. 14 and 15 the reflectance of a mirror depending on the angle of incidence and the intensity of the electrical field of the standing wave depending on the angle of incidence at an operating wavelength of 13.5 nm.
Figure 15:
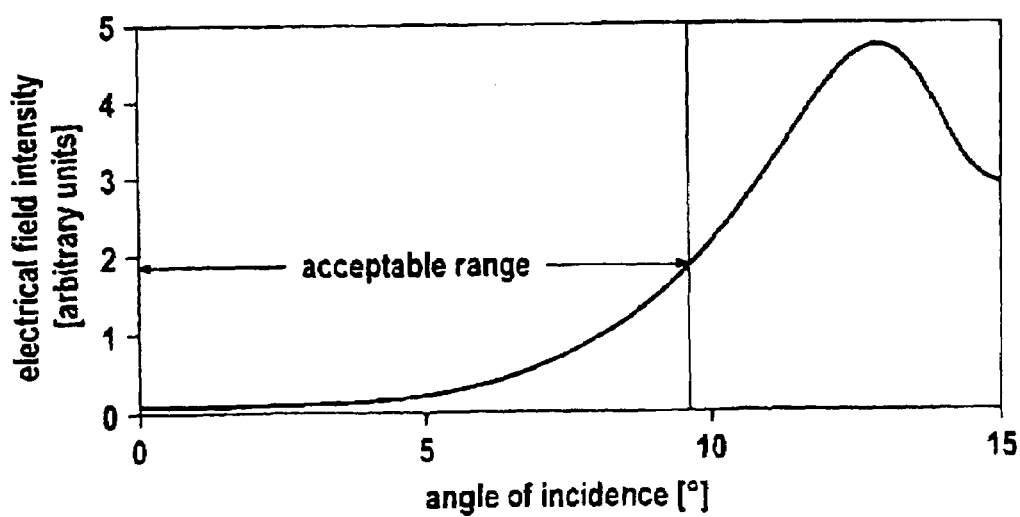

By optimizing the thickness of the layers, mirrors can be attained which feature constant reflectivity (compare FIG. 14) and low field intensity (FIG. 15) across a wide angle of incidence range. Such tolerances are in particular desirable in lithography equipment to ensure even illumination and stable operation.

FIGS. 16 to 21b relate to a manufacturing process of optical elements, wherein the optical element is finished during operation at the "operating wavelength". The cap section comprises a carbon layer which is deposited when the mirror is exposed to radiation in the EUV range and when the ambient gas comprises hydrocarbons. The following table lists the structural details of the multilayer system according to FIG. 16.

| Structure | | |
|---|---|---|
| C | Layer 33 | d = 1 nm |
| Ru | Layer 32 | d = 2 nm |
| Mo | Layer 31 | d = 1 nm |
| 60 x (MoSi$_2$/Si/MoSi$_2$/Mo) | | |
| MoSi$_2$ | Layer 11 | d = 1 nm |
| Si | Layer 11 | d = 3 nm |
| MoSi | Layer 11 | d = 1 nm |
| Mo | Layer 11 | d = 1.85 nm |
| 1 x | | |
| MoSi$_2$ | Layer 11a | d = 1 nm |
| Si | Layer 2 | d = 3 nm |
| SiO$_2$ | Substrate 1 | |

Figure 16:
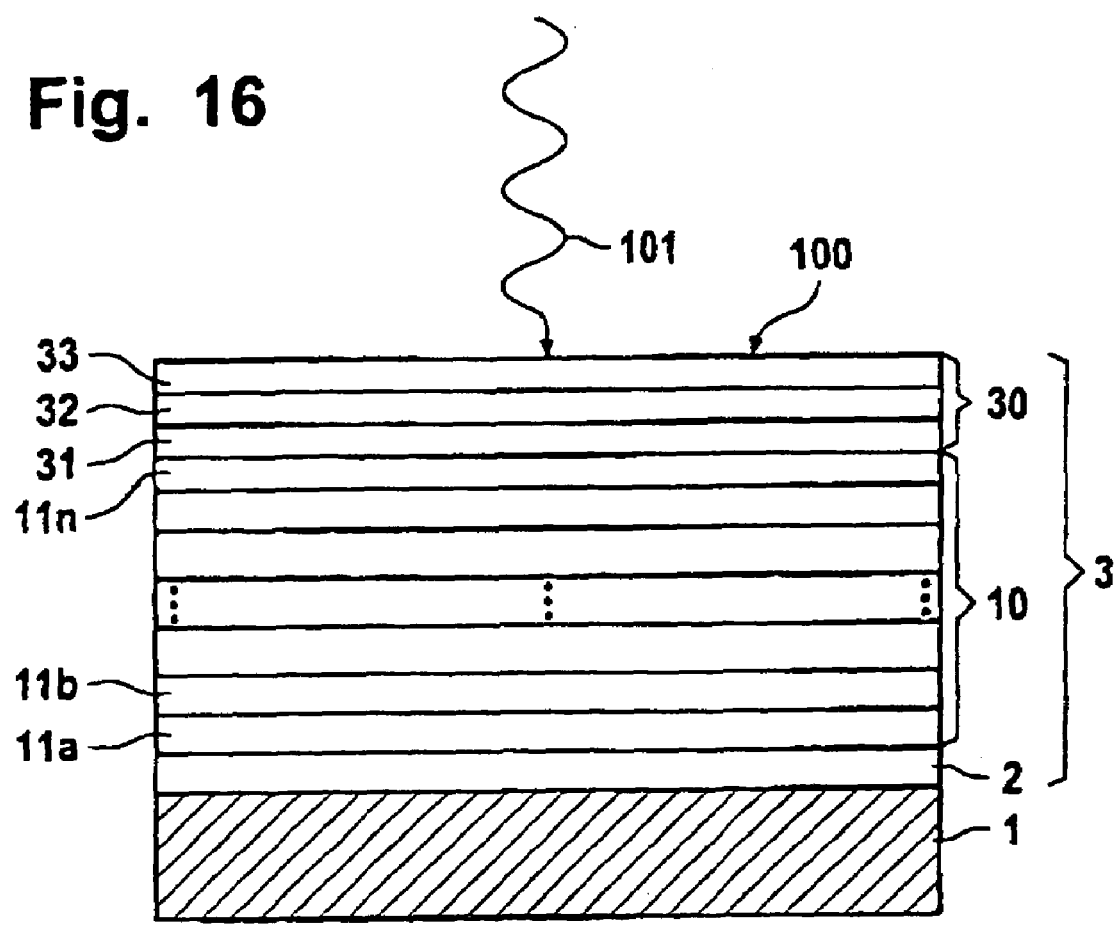
FIG. 16 a multilayer system with a carbon cap layer.
Figure 17A:
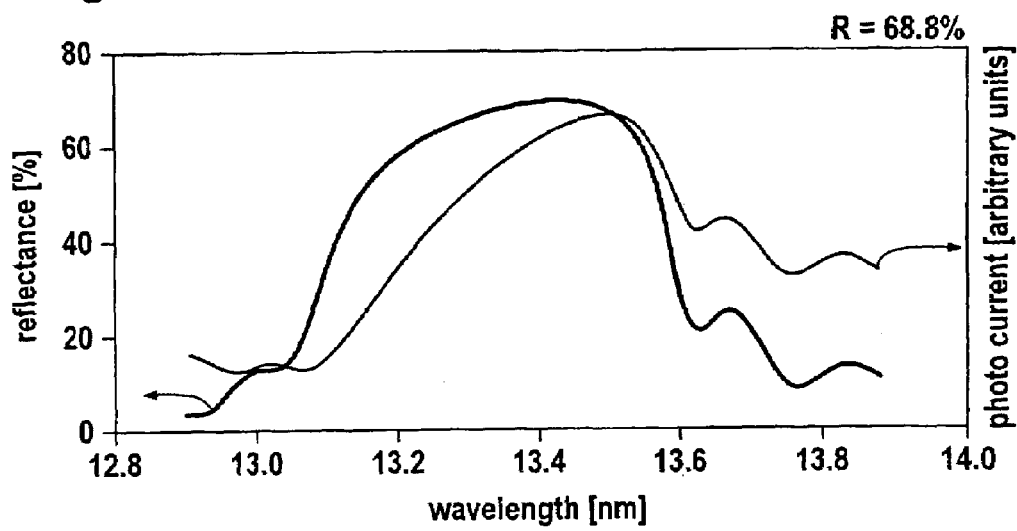
FIGS. 17a to 21b diagrams of the reflectance curves and the electrical field intensity of the standing wave for different protective carbon layer thicknesses in a multilayer system according to FIG. 16.
Figure 17B:
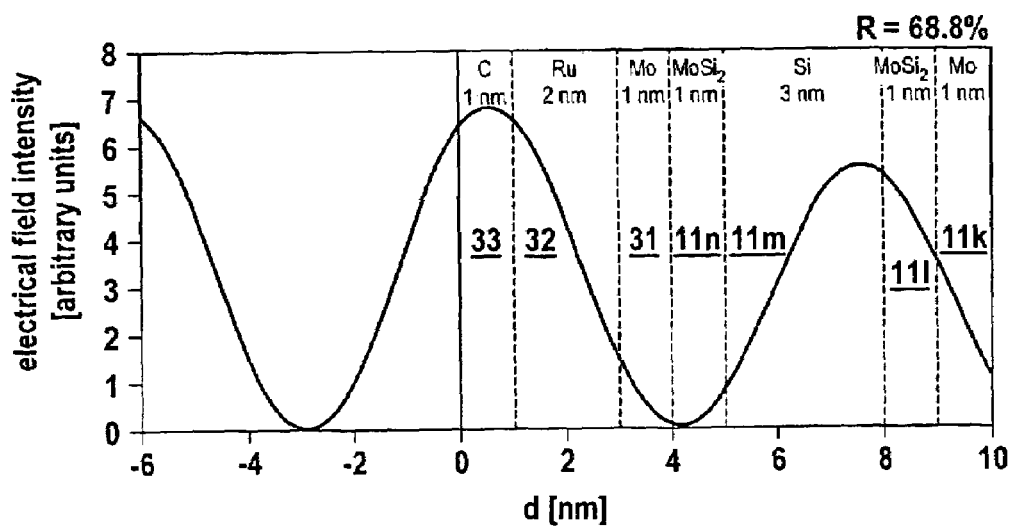

FIGS. 17a, b show the reflectance curve and the photocurrent curve depending on the irradiated wavelength as well as the electrical field intensity distribution of the standing wave at operating wavelength for the example shown in FIG. 16. In the area of the maximum of the reflectance curve, the photocurrent curve reaches very high values, due to the high electrical field intensity of the standing wave at the free interface of the multilayer system.

FIGS. 18 to 21b show the respective curves for C-layers with different thicknesses.

Figure 18A:
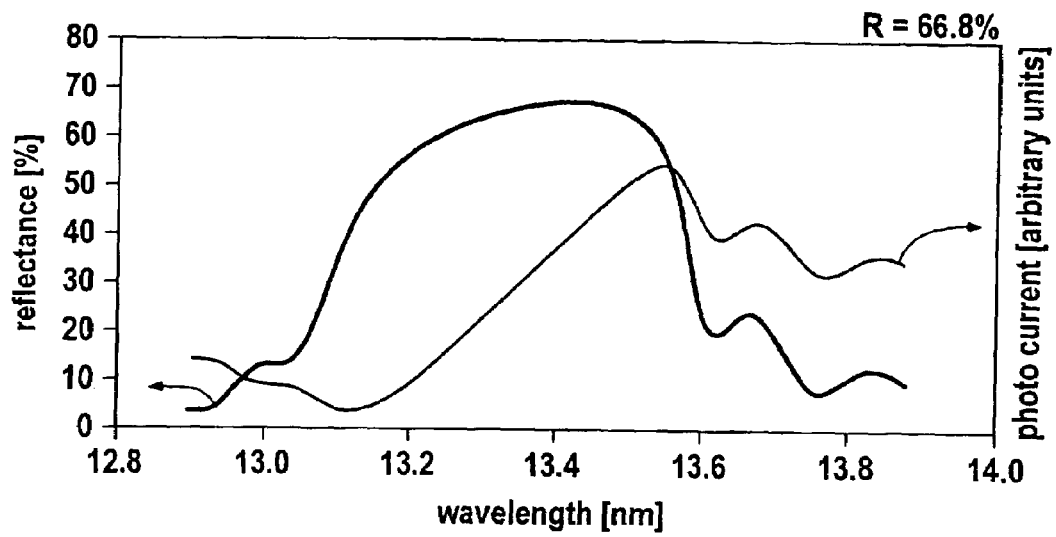
Figure 18B:
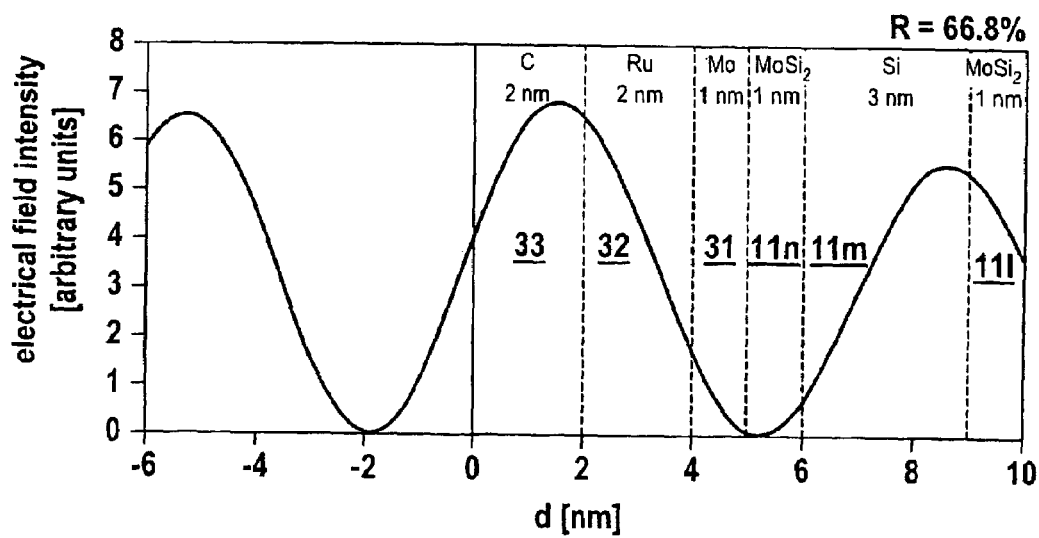
Figure 19A:
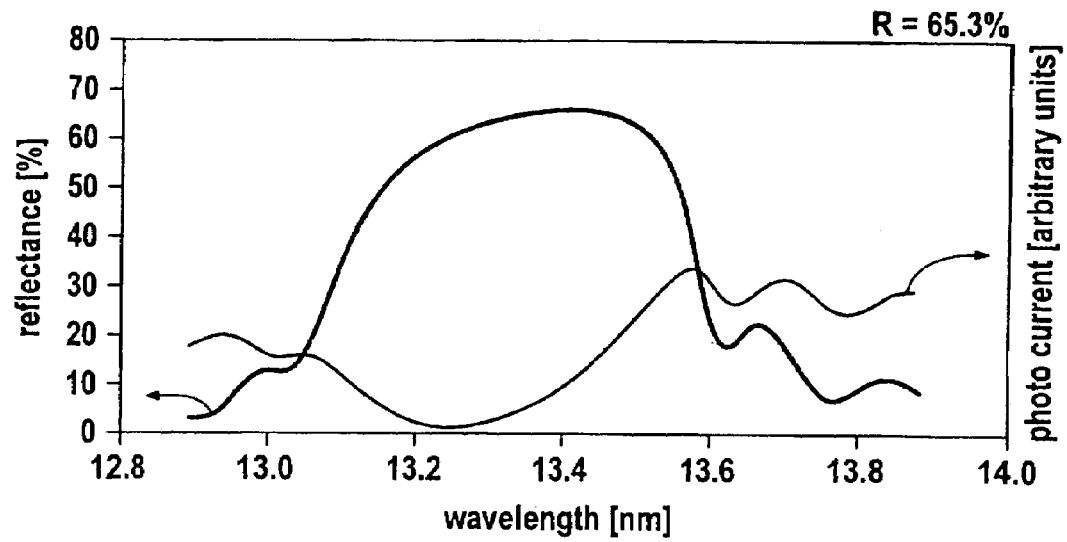
Figure 19B:
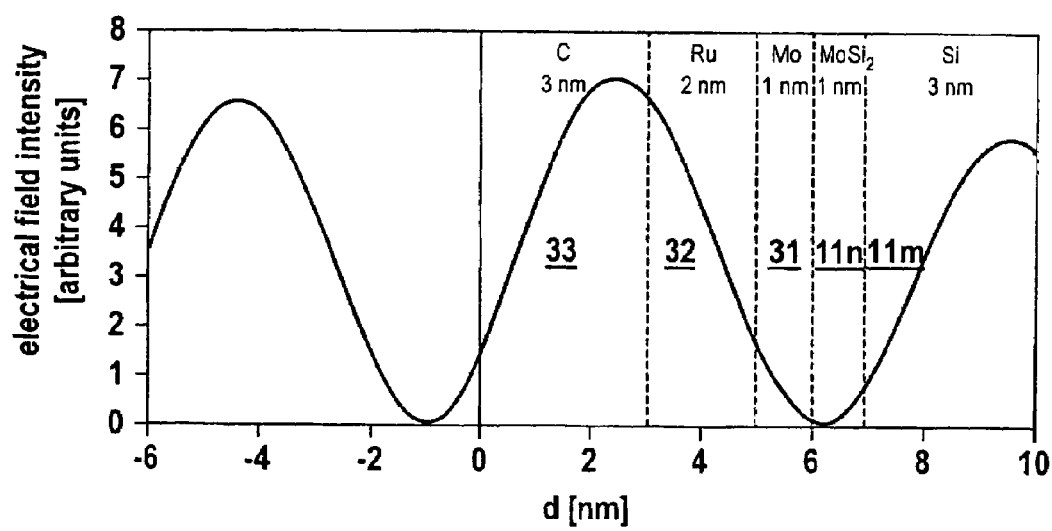
Figure 20A:
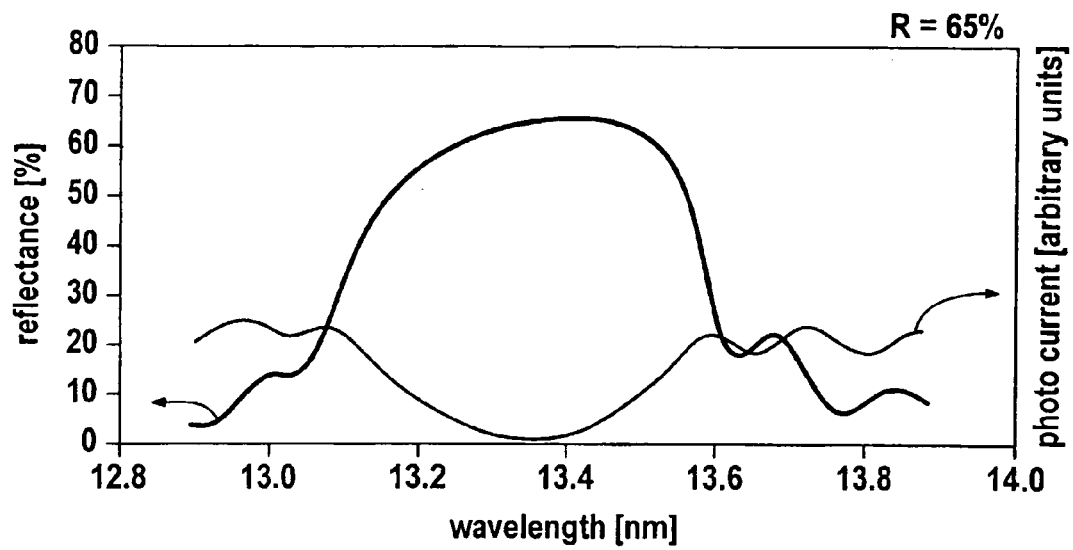
Figure 20B:
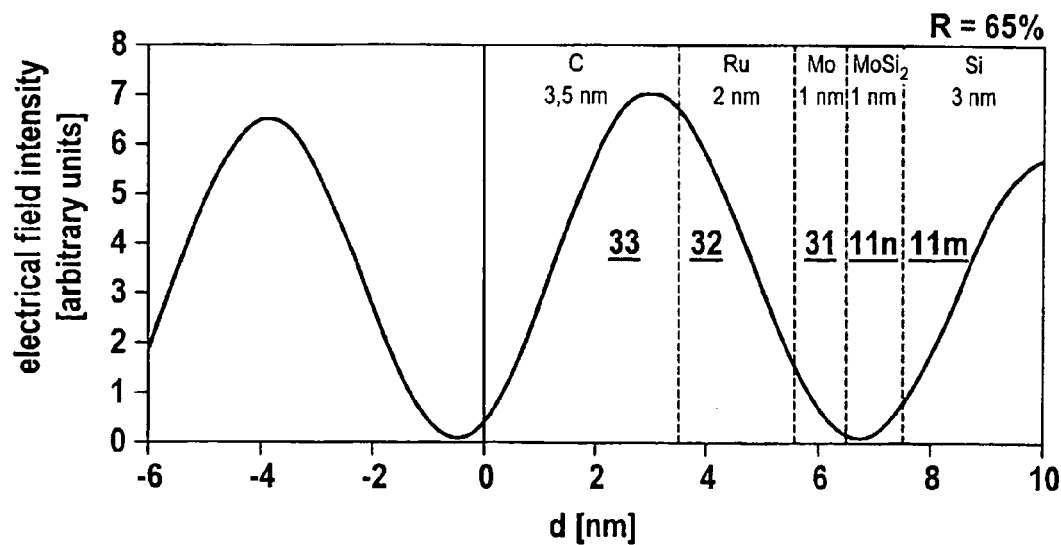
Figure 21A:
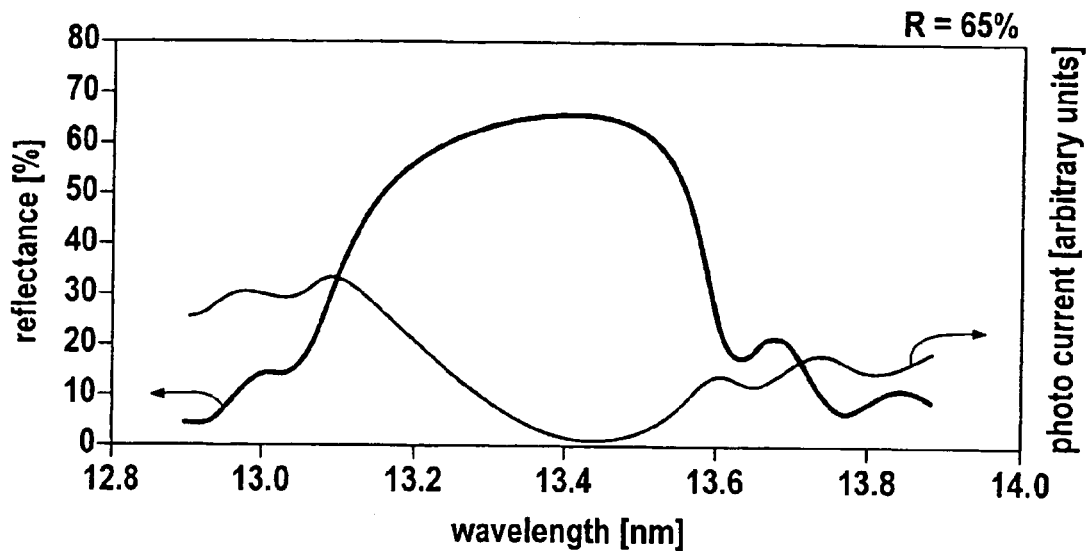
Figure 21B:
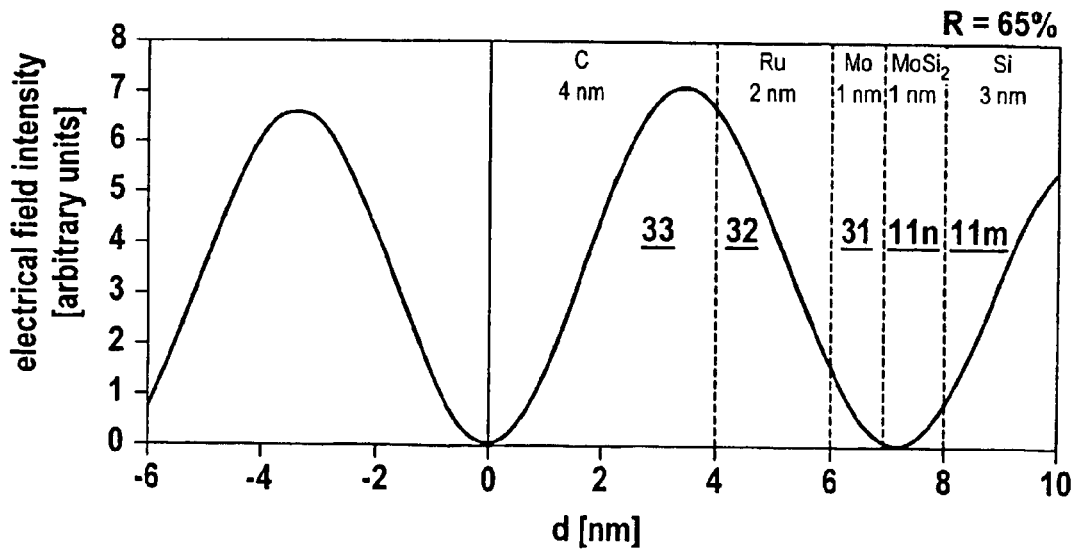

| FIGS. 18a, b: | C-layer | d = 2 nm |
|---|---|---|
| FIGS. 19a, b: | C-layer | d = 3 nm |
| FIGS. 20a, b: | C-layer | d = 3.5 nm |
| FIGS. 21a, b: | C-layer | d = 4.0 nm |

It is quite clear that, as the thickness of carbon increases, the electrical field strength at the free interface decreases. Consequently photoemission and thus also further contamination will practically vanish for the following reasons:

As the electrical field strength on the surface diminishes, fewer secondary electrons are generated;

The mass density of carbon is lower than that of ruthenium, consequently the photoelectron conversion efficiency will further diminish the rate of emission;

Thus, self-termination should occur between 3 and 4 nm carbon thickness, in other words, the carbon layer does not grow any further. This is due to diminished photoemission which in turn leads to a decrease in the breakdown of hydrocarbons and thus of contamination. This fairly substantial carbon thickness can be further decreased towards about 2 to 3 nm by further optimization of the multilayer system.

Figure 22:
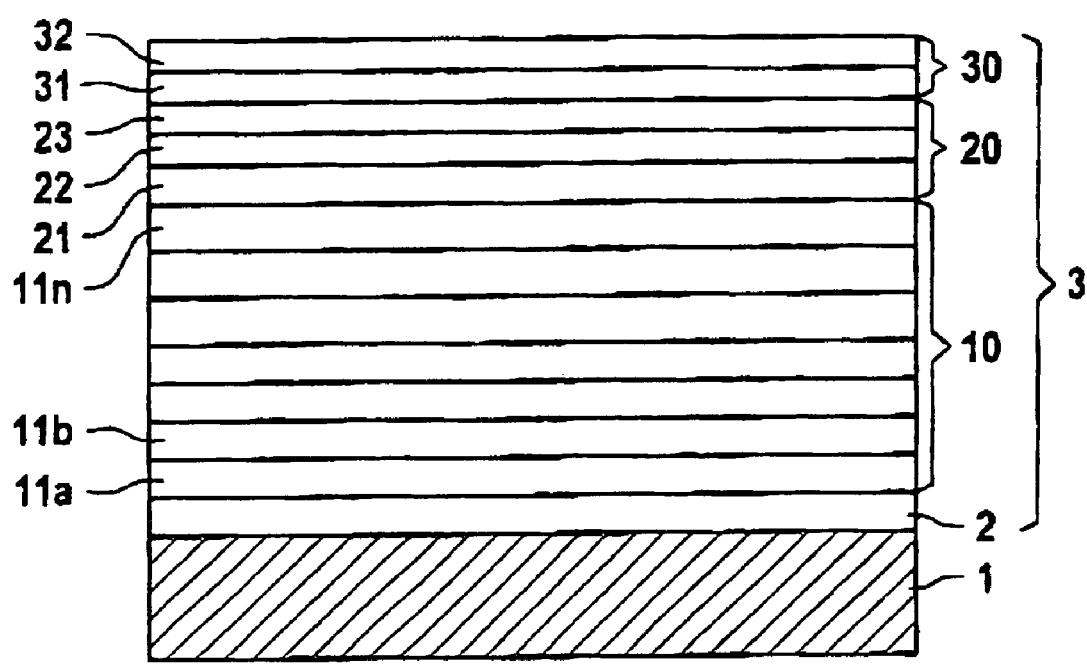
FIG. 22 an optical element comprising a multilayer system according to a further embodiment.

FIG. 22 shows the respective curves for a multilayer system which comprises the following layer design:

| Cap section 30: | layer 32 | C | d = 1 nm |
|---|---|---|---|
| | layer 31 | SiO$_2$ | d = 1.5 nm |
| Phase matching section: | layer 23 | Si | d = 1 nm |
| | | MoSi$_2$ | d = 1 nm |
| | | Mo | d = 1.85 nm |
| Resonance section 10: | 60 x: | MoSi$_2$ | d = 1 nm |
| | | Si | d = 3 nm |
| | | MoSi$_2$ | d = 1 nm |
| | | Mo | d = 1.85 nm |
| | | MoSi$_2$ | d = 1 nm |
| Buffer section 2: | | Si | d = 3 nm |
| Substrate 1: | | SiO$_2$ | |

Figure 23A:
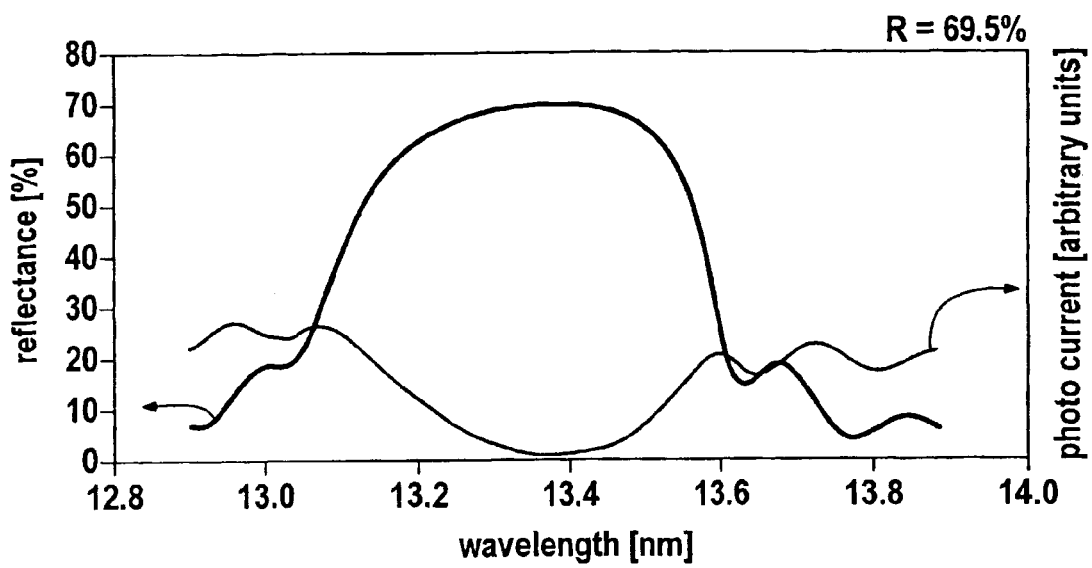
FIGS. 23a, b diagrams of the reflectance curves and the electrical field intensity of the standing wave for a protective carbon layer thickness in a multilayer system according to FIG. 22.
Figure 23B:
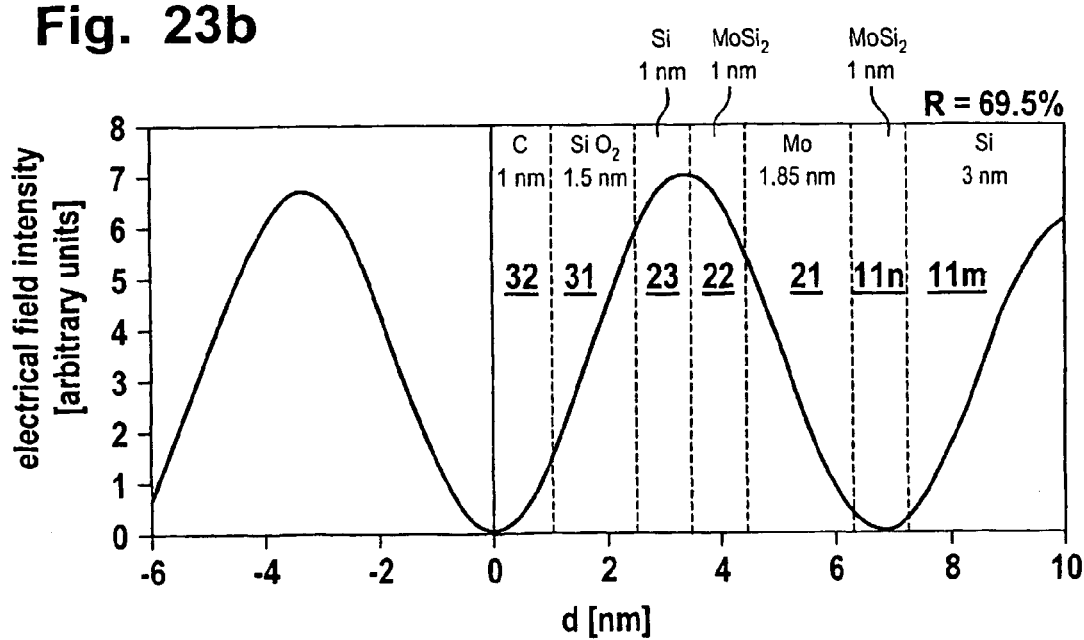

FIGS. 23a and b show the photocurrent curve and the reflectance curve as well as the electrical field intensity for the example of FIG. 22. The phase matching section has made it possible to achieve a coincidence of the maximum of the reflectance curve with the minimum of the photocurrent curve, even with a cap section of only 1 nm carbon.

| list of reference characters | |
|---|---|
| 1 | Substrate |
| 2 | Buffer section |
| 3 | Multilayer system |
| 4 | Standing wave |
| 5 | Node |
| 10 | Resonance section |
| 11a-n | Layer |
| 12 | Phase transition section |
| 13a-n | Layer |
| 20 | Further layer system, phase matching section |
| 21a-n | Layer |
| 30 | Further layer system, cap section |
| 31 | Layer |
| 32 | Protective layer |
| 100 | Free interface |
| 101 | Incident radiation |

The invention claimed is:

1. A reflecting optical element, comprising:
a substrate and an optical multilayer system whose layer materials have absorption indices $k_i \neq k_{i+1}$, wherein the layer materials have refractive indices $n_1 \neq n_{i+1}$, wherein the layer system comprises a layer pack whose reflectance is maximized for a specified operating wavelength in the EUV wavelength range (resonance section), wherein the layer material or the layer thickness of at least one layer of the resonance section, or a combination thereof is selected such that a standing wave which forms during reflection of the irradiated operating wavelength, forms a node of the electrical field strength (node condition) in an area of a free interface of the multilayer system, wherein the multilayer system comprises at least one further layer system that comprises at least one protective layer (cap section).

2. A lithography apparatus, comprising:
an illumination system for the EUV wavelength range, comprising a holding device for a mask, and comprising a substrate table, wherein the illumination device comprises a projection device for imaging an irradiated mask section on a substrate, wherein at least one reflecting optical element of the irradiation system comprises a multilayer system wherein the layer materials have absorption indices $k_i \neq k_{i+1}$, wherein the layer materials have refractive indices $n_i \neq n_{i+1}$, wherein the multilayer system comprises a layer pack whose reflectance is maximized for a specified operating wavelength in the EUV wavelength range (resonance section), wherein the layer material or the layer thickness of at least one layer of the resonance section, or a combination thereof, is selected such that a standing wave which forms during reflection of the irradiated operating wavelength, forms a node of the electrical field strength (node condition) in an area of a free interface of the multilayer system, and wherein the multilayer system comprises at least one further layer system that comprises at least one protective layer (cap section).

3. A reflecting optical element, comprising:
a substrate and an optical multilayer system whose reflectance is maximized for a specified operating wavelength in the EUV wavelength range and whose layer material have absorption indices $k_i \neq k_{i+1}$, wherein the layer materials have refractive indices $n_1 \neq n_{+1}$, and wherein the layer material or the layer thickness of at least one layer of the multilayer system, or a combination thereof is selected such that a standing wave which forms during reflection of the irradiated operating wavelength, forms a node of the electrical field strength (node condition) in an area of a free interface of the multilayer system, wherein the multilayer system comprises at least one further layer system that comprises at least one protective layer (cap section), and wherein the protective layer comprises Ru, Rh, Si, Mo, Zr, Nb, B, C, N, and/or O, or their alloys or compounds.

4. A lithography apparatus, comprising:
an illumination system for the EUV wavelength range, comprising a holding device for a mask, and comprising a substrate table, wherein the illumination device comprises a projection device for imaging an irradiated mask section on a substrate, wherein at least one reflecting optical element of the irradiation system comprises a multilayer system wherein the layer materials have absorption indices $k_i \neq k_{i+i}$ and refractive indices $n_i \neq n_{i+1}$ and the layer material or the layer thickness of at least one layer, or combinations thereof, is selected such that a standing wave, which forms during reflection of the irradiated operating wavelength, forms a node of the electrical field strength, in an area of a free interface of the multilayer system, wherein the multilayer system comprises at least one further layer system that comprises at least one protective layer (cap section) wherein the protective layer comprises Ru, Rh, Si, Mo, Zr, Nb, B, C, N, and/or O, or their alloys or compounds.

5. The optical element according to claim 1, wherein the layer thickness of at least a part of the layers of the resonance section decreases or increases as the number of layers increases.

6. The optical element according to claim 5, wherein the layer thickness of at least a part of the layers of the resonance section varies as the number of layers increases.

7. The optical element according to claim 1, wherein within the resonance section, a layer pack (phase transition section) has been provided, wherein the layer material or the layer thickness of at least one of the layers of the phase transition section, or combinations thereof is set so as to meet the node condition.

8. The optical element according to claim 1, wherein the at least one further layer system is on the resonance section, and wherein the layer material or layer thickness of at least one of the layers of the further layer system, or combinations thereof is set so as to meet the node condition.

9. The optical element according to claim 8, wherein the protective layer comprises a material with weak absorption at operating wavelengths, with the half-value thickness of said material exceeding 50 nm.

10. The optical element according to claim 8, wherein the protective layer comprises Ru, Rh, Si, Mo, Zr, Nb, B, C, N, and/or O, or their alloys or compounds.

11. The optical element according to claim 8, wherein the further layer system is arranged between the resonance section and the cap section.

12. A method for determining a design of a multilayer system of an optical element comprising the steps of: cycling through the following steps in a process of iteration at least once or several times:
A—determining the design in a modeling step by means of model calculations, taking into account the materials of the layers and the specified characteristics of the multilayer system;
B—coating the substrate during a coating step in a coating apparatus according to a previously prepared model design for the manufacture of a model element; and
C—determining during a characterization step actual characteristics of the model element; and
wherein in step A the layer material or the layer thickness of at least one layer, or combinations thereof is selected such that the standing wave which forms when the irradiated operating wavelength is reflected, in the area of the free interface of the multilayer system comprises a node of the electrical field strength.

13. The method according to claim 12, wherein iteration ceases when the position of the absolute maximum of the reflectance curve, depending on the irradiated photon energy, agrees with the position of the absolute minimum of the photocurrent curve within a quarter of the bandwidth (FWHM) of the reflectance curve.

14. A method for manufacturing an optical element in which an optical multilayer system is deposited onto a substrate, wherein the layer materials or the thickness of the layers of the multilayer system, or combinations thereof was determined by means of a method according to claim 12.

15. A method of manufacturing a reflecting optical element comprising the steps of: depositing an optical multilayer system onto a substrate using layer materials having absorption indices $k_i \neq k_{i+1}$, wherein layer materials having refractive indices $n_i \neq n_{i+1}$ are used and the layer materials or the thickness of at least one layer, or combinations thereof is selected such that a standing wave, which forms during reflection of the irradiated operating wavelength, forms a node, spaced by ±20% of the irradiated operating wavelength from the free interface of the multilayer system.

16. The method according to claim 15, wherein the thickness or the material of the layers, or combinations thereof is selected such that the node is situated in front of the free interface of the multilayer system, and that the multilayer system is exposed to a vacuum with residual gas molecules, such as hydrocarbon molecules or water molecules or combinations thereof, and exposed to irradiation in the EUV wavelength range.

17. The lithography apparatus according to claim 2, wherein the reflecting optical element is a mirror.

18. The lithography apparatus according to claim 2, wherein the reflecting optical element is a mask.

19. A method for producing a semiconductor element, involving the steps of:
    providing a semiconductor substrate which is at least in part coated with a radiation-sensitive material;
    providing a photomask; and
    illuminating the photomask and imaging said photomask on the radiation-sensitive coating of the semiconductor substrate; wherein for illumination or imaging, or combinations thereof, an optical system is used which comprises at least one optical element according to claim 1.

20. A semiconductor device manufactured in accordance with the method according to claim 19.

21. The method according to claim 12, wherein in step C, a reflectance curve and photocurrent curve, which both depend on the irradiated photon energy, are measured and that iteration ceases when the absolute maximum of the reflectance curve agrees with the absolute minimum of the photocurrent curve within a specified range.

22. The method according to claim 12, wherein the iteration process is completed when the actual characteristics within a specified bandwidth agree with the specified characteristics.

23. A lithography apparatus, comprising:
an illumination system for the EUV wavelength range and a projection device for imaging an irradiated mask section on a substrate, comprising at least one reflective optical element, which comprises a substrate and an optical multilayer system whose reflectance is maximized for a specified operating wavelength in the EUV wavelength range, wherein the multilayer system comprises a first section, which is optimized for high reflectance and a second section, which comprises at least one protective layer, wherein the protective layer comprises Ru, Rh, Si, Mo, Zr, Nb, B, C, N and/or O, or their alloys or compounds, and wherein during operation of said lithography apparatus a standing electromagnetic wave forms in the multilayer system, and wherein a mode of the electrical field strength is located in an area of the free interface.

24. A lithography apparatus, comprising:
an illumination system for the EUV wavelength range and a projection device for imaging an irradiated mask section on a substrate, comprising at least one reflective optical element, which comprises a substrate and an optical multilayer system whose reflectance is maximized for a specified operating wavelength in the EUV wavelength range, wherein the multilayer system comprises a first section, which is optimized for high reflectance and a second section, which comprises at least one protective layer, wherein the protective layer comprises Ru, Rh, Si, Mo, Zr, Nb, B, C, N and/or O, or their alloys or compounds, and wherein upon irradiation of said optical element with said operating wavelength the value of a surface electric field intensity is a minimum.

* * * * *

UNITED STATES PATENT AND TRADEMARK OFFICE
CERTIFICATE OF CORRECTION

| | | |
|---|---|---|
| PATENT NO. | : 7,172,788 B2 | |
| APPLICATION NO. | : 10/491764 | |
| DATED | : February 6, 2007 | |
| INVENTOR(S) | : Audrey Yakshin et al. | |

It is certified that error appears in the above-identified patent and that said Letters Patent is hereby corrected as shown below:

In Claim 23, Col. 16, second to last line, please replace "mode" with --node--.

Signed and Sealed this

Fifteenth Day of May, 2007

JON W. DUDAS
*Director of the United States Patent and Trademark Office*